US011038114B2

(12) United States Patent
Choi et al.

(10) Patent No.: US 11,038,114 B2
(45) Date of Patent: Jun. 15, 2021

(54) METHOD FOR MANUFACTURING ORGANIC SOLAR CELL AND ORGANIC SOLAR CELL MANUFACTURED BY USING THE SAME

(71) Applicant: LG CHEM, LTD., Seoul (KR)

(72) Inventors: Doowhan Choi, Daejeon (KR); Jiyoung Lee, Daejeon (KR); Songrim Jang, Daejeon (KR); Bogyu Lim, Daejeon (KR); Junghyun Park, Daejeon (KR)

(73) Assignee: LG CHEM, LTD.

( * ) Notice: Subject to any disclaimer, the term of this patent is extended or adjusted under 35 U.S.C. 154(b) by 142 days.

(21) Appl. No.: 16/493,324

(22) PCT Filed: Feb. 27, 2019

(86) PCT No.: PCT/KR2019/002356
§ 371 (c)(1),
(2) Date: Sep. 12, 2019

(87) PCT Pub. No.: WO2019/172571
PCT Pub. Date: Sep. 12, 2019

(65) Prior Publication Data
US 2021/0135120 A1    May 6, 2021

(30) Foreign Application Priority Data
Mar. 6, 2018 (KR) .................. 10-2018-0026289

(51) Int. Cl.
*H01L 51/42* (2006.01)
*H01L 51/00* (2006.01)

(52) U.S. Cl.
CPC ...... *H01L 51/0068* (2013.01); *H01L 51/0036* (2013.01); *H01L 51/0069* (2013.01);
(Continued)

(58) Field of Classification Search
CPC ..... H01L 51/42; H01L 51/48; H01L 31/0256; H01L 51/46; C07D 519/00; C08G 61/12
See application file for complete search history.

(56) References Cited

U.S. PATENT DOCUMENTS

2006/0225778 A1* 10/2006 Brabec ............... H01G 9/2027
136/244
2016/0372680 A1   12/2016 Lim et al.
(Continued)

FOREIGN PATENT DOCUMENTS

EP        3223328       9/2017
JP       2009088104     4/2009
(Continued)

OTHER PUBLICATIONS

Gong et al. "Influence of polymer side chains on the photovoltaic performance of non-fullerene organic solar cells" Journal of Materials Chemistry C, 5:937-942 (2017).

*Primary Examiner* — Dung A. Le
(74) *Attorney, Agent, or Firm* — Myers Bigel, P.A.

(57) ABSTRACT

A method for manufacturing an organic solar cell according to an exemplary embodiment of the present application comprises: preparing a substrate; forming a first electrode on the substrate; forming a photoactive layer on the first electrode; drying the photoactive layer with a wind force of 0.01 Mpa to 0.07 Mpa; and forming a second electrode on the photoactive layer.

13 Claims, 2 Drawing Sheets

(52) U.S. Cl.
CPC ...... *H01L 51/0074* (2013.01); *H01L 51/0003* (2013.01); *H01L 51/424* (2013.01)

(56) References Cited

U.S. PATENT DOCUMENTS

| | | | |
|---|---|---|---|
| 2018/0033970 A1 | 2/2018 | Lee et al. | |
| 2018/0323329 A1* | 11/2018 | Jaramillo Isaza | H01L 31/075 |
| 2019/0393423 A1* | 12/2019 | Yan | H01L 51/005 |
| 2020/0067003 A1* | 2/2020 | Cominetti | H01L 51/0037 |

FOREIGN PATENT DOCUMENTS

| | | |
|---|---|---|
| JP | 2013004874 | 1/2013 |
| KR | 20110128509 | 11/2011 |
| KR | 20150121661 | 10/2015 |
| KR | 20160075370 | 6/2016 |
| KR | 20170113194 | 10/2017 |
| KR | 20180005920 | 1/2018 |

* cited by examiner

METHOD FOR MANUFACTURING ORGANIC SOLAR CELL AND ORGANIC SOLAR CELL MANUFACTURED BY USING THE SAME

CROSS REFERENCE TO RELATED APPLICATIONS

This application is a 35 U.S.C. § 371 national stage application of PCT International Application No. PCT/KR2019/002356, filed Feb. 27, 2019, which claims priority from Korean Patent Application Nos. 10-2018-0026289, filed Mar. 6, 2018, the contents of which are incorporated herein in their entireties by reference.

TECHNICAL FIELD

The present application relates to a method for manufacturing an organic solar cell and an organic solar cell manufactured by using the same.

BACKGROUND ART

Solar cells that occupy about 90% of the global solar cell market are solar cells based on silicon materials. Since silicon solar cells require high material costs and manufacturing costs, silicon solar cells still have a limitation in generating electricity on a large scale like nuclear power generation and thermal power generation. As a way for solving the problems of silicon-based solar cells, solar cell devices using organic materials have emerged, and the reason is that there is an advantage in that the organic solar cell can produce a device at lower costs.

The organic solar cell is mostly composed of an anode, a photoactive layer, and a cathode. In general, an organic material is used as the photoactive layer, and indium tin oxide (ITO) and aluminum (Al) are usually used in the anode and the cathode, respectively, but currently, studies on the replacement of even anode and cathode electrode materials with organic materials have been actively conducted worldwide. Further, the energy conversion efficiency tends to be gradually increased according to the study results of new organic polymers having a low band-gap.

In general, an organic solar cell has a structure composed of an anode electrode/a hole transfer layer/a photoactive layer/an electron transport layer/a cathode electrode, and a method for forming the photoactive layer is largely classified into two methods of a method for manufacturing a thin film by using a method of depositing an electron donor and an electron acceptor in the vacuum atmosphere and a method for manufacturing a thin film by using a solution process. More specifically, the method using deposition uses single molecules as both an electron donor and an electron acceptor, whereas the method using a solution process generally uses a polymer as an electron donor and a polymer, a fullerene derivative, a perylene derivative, quantum dot inorganic nanoparticles, and the like as an electron acceptor. Therefore, when a solution process using a polymer is used instead of a case where a single molecule is deposited and used, a device having a large area may be mass-produced at low costs without requiring a vacuum technology, so that studies have been recently concentrated on the solution process using a polymer.

DETAILED DESCRIPTION OF INVENTION

Technical Problem

The present application has been made in an effort to provide a method for manufacturing an organic solar cell and an organic solar cell manufactured by using the same.

Technical Solution

An exemplary embodiment of the present application provides a method for manufacturing an organic solar cell, the method comprising:
preparing a substrate;
forming a first electrode on the substrate;
forming a photoactive layer on the first electrode;
drying the photoactive layer with a wind force of 0.01 Mpa to 0.07 Mpa; and
forming a second electrode on the photoactive layer.

Further, another exemplary embodiment of the present application provides an organic solar cell manufactured by the method for manufacturing an organic solar cell.

Advantageous Effects

According to the method for manufacturing an organic solar cell according to an exemplary embodiment of the present application, it is possible to induce an appropriate phase separation between an electron donor and an electron acceptor by optimizing the drying of a photoactive layer formed by a bar, a slot die, and the like.

Further, an organic solar cell manufactured by the method for manufacturing an organic solar cell according to an exemplary embodiment of the present application has an effect in that the energy conversion efficiency is excellent.

EXPLANATION OF REFERENCE NUMERALS AND SYMBOLS

Figure 1:
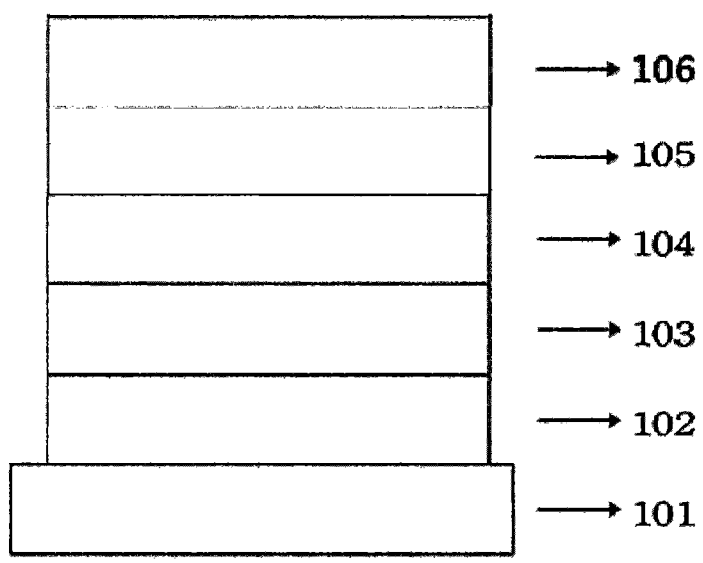
FIG. 1 is a view schematically illustrating an organic solar cell according to an exemplary embodiment of the present application.

101: Substrate
102: First electrode
103: Electron transport layer
104: Photoactive layer
105: Hole transport layer
106: Second electrode

BEST MODE

Hereinafter, the present application will be described in more detail.

When one member is disposed "on" another member in the present specification, this comprises not only a case where the one member is brought into contact with another member, but also a case where still another member is present between the two members.

When one part 'comprises' one constituent element in the present specification, unless otherwise specifically described, this does not mean that another constituent element is excluded, but means that another constituent element may be further comprised.

In the present specification, the 'unit' means a repeated structure comprised in a monomer of a polymer, and a structure in which the monomer is bonded into the polymer by polymerization.

In the present specification, the meaning of 'comprising a unit' means that the unit is comprised in a main chain in the polymer.

In the present specification, the energy level means a size of energy. Accordingly, even when the energy level is expressed in the negative (−) direction from the vacuum level, it is interpreted that the energy level means an absolute value of the corresponding energy value. For example, the HOMO energy level means the distance from the vacuum level to the highest occupied molecular orbital. Further, the LUMO energy level means the distance from the vacuum level to the lowest unoccupied molecular orbital.

Since organic solar cells are light and flexible and may realize various colors, studies have been conducted in many places, but most of the studies is only for manufacturing a unit device (9 mm$^2$) using spin-coating. The spin-coating and the large-area coating methods such as slot-die, bar, and ink-jet are fundamentally and greatly different in the drying method of a photoactive layer.

In the large-area coating method, mostly, the photoactive layer is naturally dried in the atmosphere or dried by using heat, and the large-area coating method is concentrated on the heat treatment after drying instead of the drying method. In addition, in a combination of a single molecule donor having a low viscosity: PCBM and a polymer donor having a characteristic in that an optimum thickness of a photoactive layer is 100 nm or less: ITIC, it is difficult to manufacture a module by a method which is not spin-coating.

Therefore, the present application has been made in an effort to manufacture a high-efficiency organic solar cell module by optimizing the drying of a photoactive layer formed by a bar, a slot-die, and the like, which are used in the large-area coating method.

A method for manufacturing an organic solar cell according to an exemplary embodiment comprises: preparing a substrate; forming a first electrode on the substrate; forming a photoactive layer on the first electrode; drying the photoactive layer with a wind force of 0.01 Mpa to 0.07 Mpa; and forming a second electrode on the photoactive layer.

According to an exemplary embodiment of the present application, the method comprises drying a photoactive layer of an organic solar cell with a wind force of 0.01 Mpa to 0.07 Mpa to adjust the morphology of the photoactive layer.

When light is applied to a photoactive layer of an organic solar cell, an exciton is generated, and the exciton moves to a bonding position of an electron donor material and an electron acceptor material by diffusion. The respective excitons moved to the interface between an electron donor and an electron acceptor are separated into electrons and holes, and power is generated while charges are transported to electrodes.

According to an exemplary embodiment of the present specification, an electron donor and an electron acceptor of the photoactive layer form a bulk heterojunction (BHJ).

In the case of a bulk heterojunction device, the separation of excitons into charges is very effective when an electron donor and an electron acceptor are completely randomly mixed, but there is a problem in that when these separated charges move to the respective electrodes, recombination is likely to occur. That is, in order to minimize the possibility of recombination of separated charges while solving the bottleneck phenomenon of excitons, the surface area for the interaction between the electron donor and the electron acceptor in the bulk heterojunction structure needs to be increased, but the respective electrons and holes need to be smoothly transported by an appropriate phase separation.

The appropriate phase separation may be adjusted by controlling the morphology of the photoactive layer.

In the related art, a heat-treatment process after drying was performed in order to control the morphology of the photoactive layer. However, in this case, since the heat treatment is performed at high temperature, there is a problem in that a substrate itself is damaged or a photoactive layer is damaged, and there is a problem in that the costs are increased because an additional process is performed.

According to the method of drying a photoactive layer according to an exemplary embodiment of the present application, there is an advantage in that the morphology of the photoactive layer can be controlled only by a drying process without any additional process, and as a result, the photoactive layer is less damaged.

Further, in the case of a drying process using hot wind in the related art, there is a problem in that a photoactive layer is dried from the surface thereof by the gas flow rate while the gas is injected, and as a result, the photoactive layer is not uniformly dried.

According to an exemplary embodiment of the present application, the drying of the photoactive layer may comprise drying the photoactive layer with a wind force of 0.01 Mpa to 0.07 Mpa to effectively control the morphology and interface of the photoactive layer.

In an exemplary embodiment of the present application, the drying of the photoactive layer may comprise drying the photoactive layer by wind, and in this case, the intensity of the wind may be 0.01 Mpa to 0.07 Mpa, and is more preferably 0.03 Mpa to 0.05 Mpa. In an organic solar cell, an electron donor and an electron acceptor need to be appropriately mixed in the form of a bulk heterojunction (BHJ), but a morphology formed when a coated solution is dried is affected by the intensity of wind drying. In an exemplary embodiment of the present application, when the intensity of wind is less than 0.01 Mpa in the drying of the photoactive layer by wind, the drying time is prolonged, so that the domain size of material may be increased, and when the intensity of wind is more than 0.07 Mpa, there may occur a disadvantage in that two materials fail to form an appropriate domain size. Further, not only the size of each domain, but also the molecular crystallinity of each material are important factors that affect the mobility of electrons or holes, and when the intensity of wind in the drying of the photoactive layer by wind satisfies 0.01 Mpa to 0.07 Mpa, an excellent effect may be obtained.

In an exemplary embodiment of the present application, the drying of the photoactive layer with the wind force may be performed by using equipment that blows the wind uniformly on the surface of the photoactive layer at a height of 0.2 cm to 5 cm, preferably 1 cm to 3 cm from the surface of the photoactive layer. In this case, the temperature may be 22° C. to 27° C. and the humidity may be 20% to 35%, but the temperature and humidity are not limited thereto.

In an exemplary embodiment of the present application, the direction of the wind may be a direction from top to bottom or at an angle of 45 degrees to 90 degrees based on the substrate. Furthermore, in an exemplary embodiment of the present application, the wind may use nitrogen or air free of moisture, and the spatial condition in the drying of the photoactive layer by wind is not particularly limited.

In an exemplary embodiment of the present application, the drying of the photoactive layer by wind may use an air regulator, and the intensity of the wind of 0.01 Mpa to 0.07 Mpa may be controlled by using the pressure of the air regulator.

Figure 2:
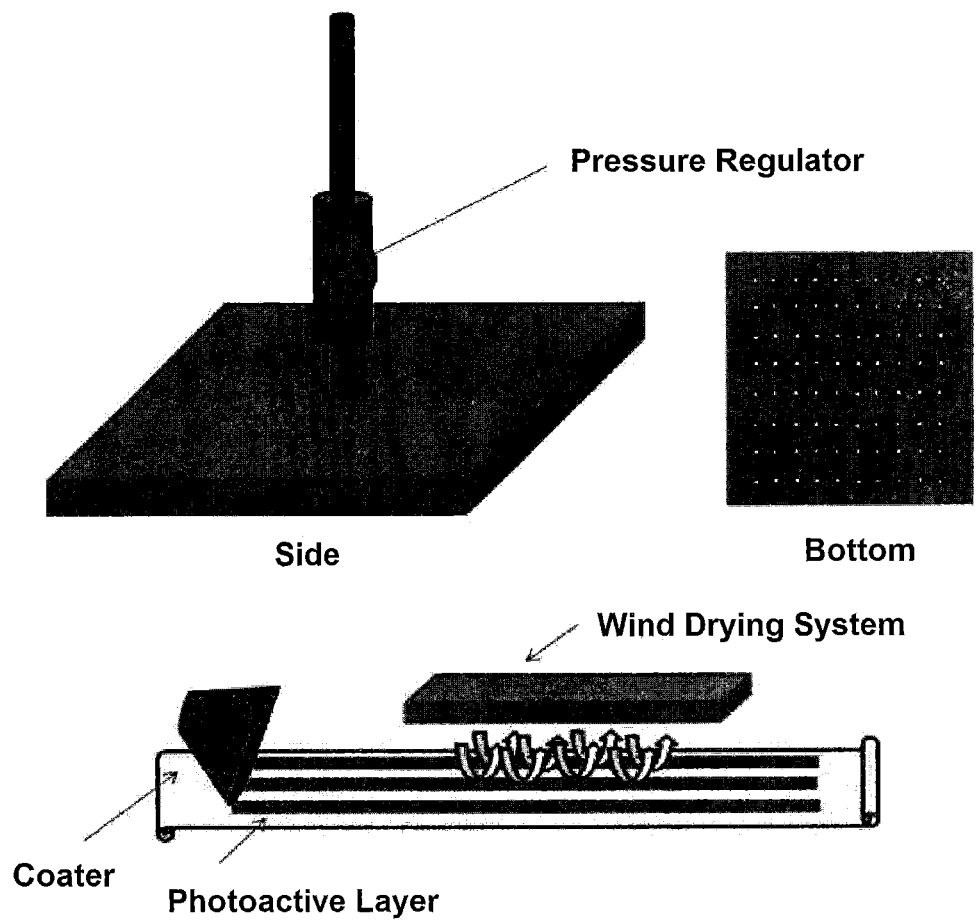
FIG. 2 is a view schematically illustrating the drying of a photoactive layer as an exemplary embodiment of the present application.

As an exemplary embodiment of the present application, the drying of the photoactive layer is schematically illustrated in the following FIG. 2.

According to an exemplary embodiment of the present application, the forming of the photoactive layer may use a slot die, a bar coater, a doctor blade, or dip coating. According to an exemplary embodiment of the present application, since the photoactive layer may be formed by using a slot die, a bar coater, a doctor blade, or dip coating as described above, there is a characteristic in that an organic solar cell having a large area may be produced with reproducibility.

In particular, according to an exemplary embodiment of the present application, it is preferred that the photoactive layer comprises an electron donor of a single molecular compound and an electron acceptor of a fullerene-based compound, or the photoactive layer comprises an electron donor of a polymer compound and an electron acceptor of a non-fullerene-based compound. In such a case, when a photoactive layer is formed by the large-area coating method except for spin coating and the above-described drying method with the wind force of 0.01 Mpa to 0.07 Mpa, an organic solar cell having excellent energy conversion efficiency may be manufactured.

In an exemplary embodiment of the present application, the photoactive layer may comprise an electron donor and an electron acceptor, the electron donor may comprise a single molecular compound, and the electron acceptor may comprise a fullerene-based compound. In this case, the single molecular compound may comprise a compound represented by the following Formula 1.

R1 to R12 and R21 to R28 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group comprising one or more of N, O, and S atoms, G1 and G2 are the same as or different from each other, and are each independently a substituted or unsubstituted branched alkyl group, and A1 and A2 are the same as or different from each other, and are each independently a structure which acts as an electron acceptor.

According to an exemplary embodiment of the present application, in Formula 1, A1 and A2 are the same as or different from each other, and are each independently any one of the following structures.

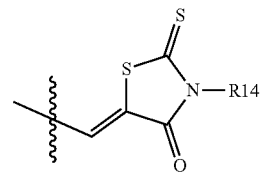

[Formula 1]

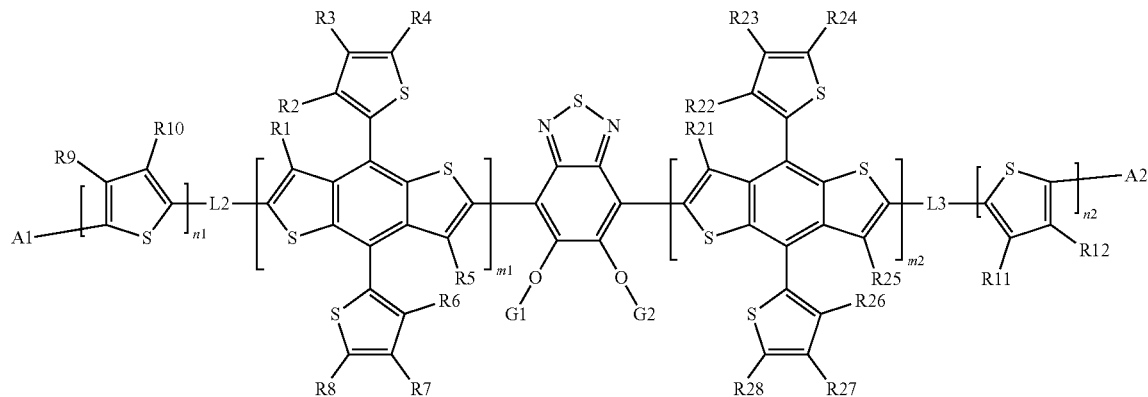

In Formula 1, m1, m2, n1, and n2 are each an integer from 1 to 3, when m1, m2, n1, and n2 are each 2 or more, two or more structures in the square bracket are the same as or different from each other, L2 and L3 are the same as or different from each other, and are each independently a direct bond; or a divalent linking group, -continued

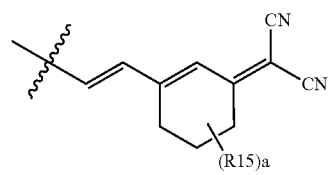

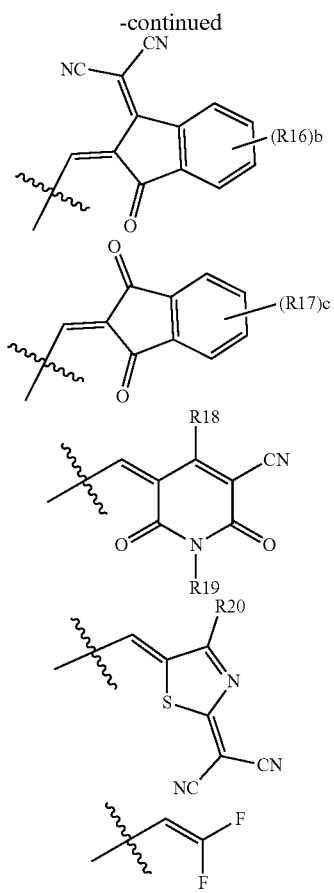

In the structures, a is an integer from 1 to 7, b and c are each an integer from 1 to 4, when a is 2 or more, two or more R15's are the same as or different from each other, when b is 2 or more, two or more R16's are the same as or different from each other, when c is 2 or more, two or more R17's are the same as or different from each other, and R14 to R20 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group comprising one or more of N, O, and S atoms.

According to an exemplary embodiment of the present application, in Formula 1, R1 to R12 and R21 to R28 are the same as or different from each other, and are each independently hydrogen; or a substituted or unsubstituted straight-chained or branched alkyl group.

According to an exemplary embodiment of the present application, in Formula 1, R1 to R12 and R21 to R28 are the same as or different from each other, and are each independently hydrogen; or a substituted or unsubstituted straight-chained or branched alkyl group having 1 to 30 carbon atoms.

According to an exemplary embodiment of the present application, in Formula 1, R1 to R12 and R21 to R28 are the same as or different from each other, and are each independently hydrogen; or a substituted or unsubstituted straight-chained or branched alkyl group having 1 to 20 carbon atoms.

According to an exemplary embodiment of the present application, in Formula 1, R1 to R12 and R21 to R28 are the same as or different from each other, and are each independently hydrogen; or a substituted or unsubstituted straight-chained or branched alkyl group having 1 to 10 carbon atoms.

According to an exemplary embodiment of the present application, in Formula 1, R1 to R12 and R21 to R28 are the same as or different from each other, and are each independently hydrogen; a substituted or unsubstituted octyl group; or a substituted or unsubstituted 2-ethylhexyl group.

According to an exemplary embodiment of the present application, in Formula 1, R1 to R12 and R21 to R28 are the same as or different from each other, and are each independently hydrogen; an octyl group; or a 2-ethylhexyl group.

According to an exemplary embodiment of the present application, in Formula 1, R4, R8, R24, and R28 are each a 2-ethylhexyl group.

According to an exemplary embodiment of the present application, in Formula 1, R9 to R12 are the same as or different from each other, and are each independently hydrogen; or an octyl group.

According to an exemplary embodiment of the present application, in Formula 1, A1 and A2 are the same as or different from each other, and are each independently

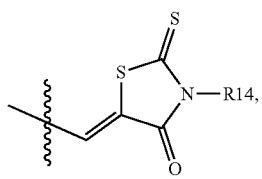

and R14 is a substituted or unsubstituted straight-chained or branched alkyl group.

According to an exemplary embodiment of the present application, in Formula 1, G1 and G2 are the same as or different from each other, and are each independently a substituted or unsubstituted branched alkyl group having 3 to 10 carbon atoms.

According to an exemplary embodiment of the present application, in Formula 1, G1 and G2 are the same as or different from each other, and are each independently a substituted or unsubstituted 2-ethylhexyl group.

According to an exemplary embodiment of the present application, in Formula 1, G1 and G2 are each a 2-ethylhexyl group.

According to an exemplary embodiment of the present application, Formula 1 may be represented by the following Formula 1-1.

[Formula 1-1]

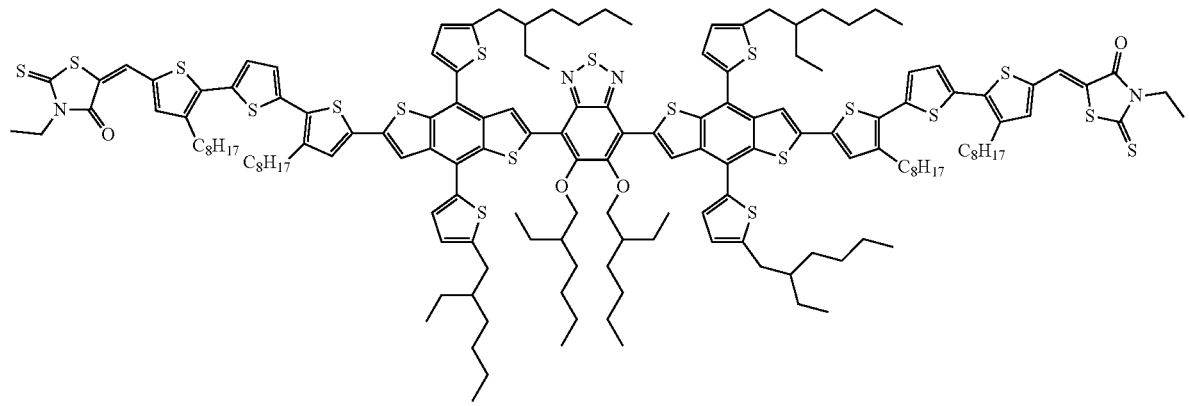

In an exemplary embodiment of the present application, the photoactive layer may comprise an electron donor and an electron acceptor, the electron donor may comprise a single molecular compound, and the electron acceptor may comprise a fullerene-based compound. In this case, the single molecular compound may comprise a compound represented by the following Formula 2.

[Formula 2]

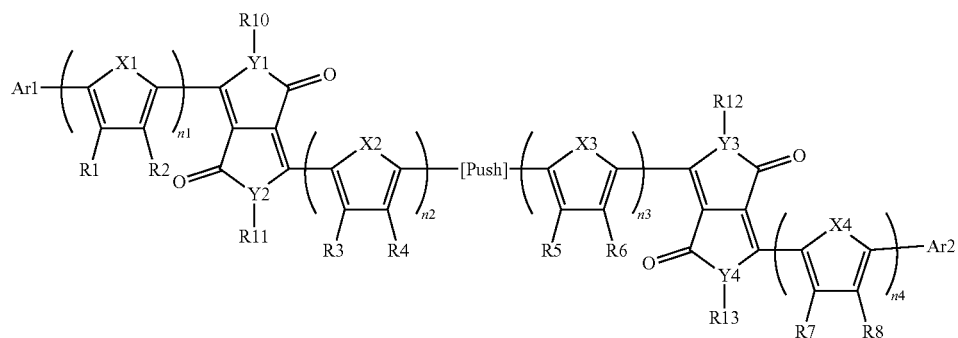

In Formula 2, n1 to n4 are each an integer from 1 to 3, when n1 to n4 are each 2 or more, two or more structures in the parenthesis are the same as or different from each other, X1 to X4 are the same as or different from each other, and are each independently CRR', NR, O, SiRR', PR, S, GeRR', Se, or Te, Y1 to Y4 are the same as or different from each other, and are each independently CR'', N, SiR'', P, or GeR'', R, R', R'', R1 to R8, and R10 to R13 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group, and

[Push] has a structure which acts as an electron donor, and the structure is any one of the following structures, c and c' are each an integer from 1 to 3, when c is 2 or more, two or more R100's are the same as or different from each other, when c' is 2 or more, two or more R101's are the same as or different from each other, X10 to X13 are the same as or different from each other, and are each independently CRaRb, NRa, O, SiRaRb, PRa, S, GeRaRb, Se, or Te, Y10 and Y11 are the same as or different from each other, and are each independently CRc, N, SiRc, P, or GeRc, Ra, Rb, Re, and R100 to R103 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group, and Ar1 and Ar2 are the same as or different from each other, and are each independently any one of the following structures,

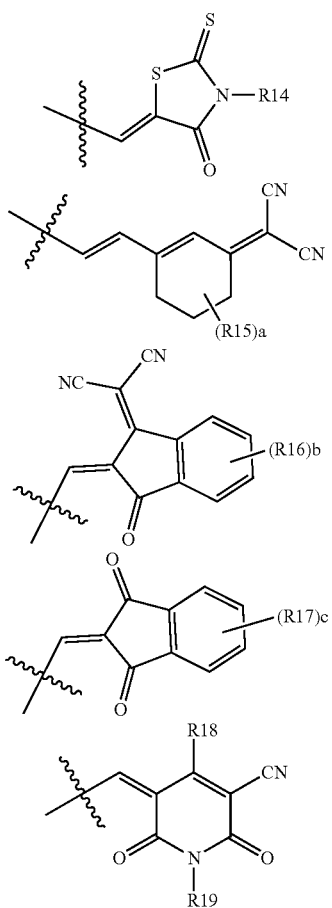

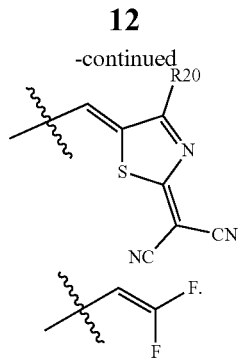

in the structures, a is an integer from 1 to 7, b and c are each an integer from 1 to 4, when a is 2 or more, two or more R15's are the same as or different from each other, when b is 2 or more, two or more R16's are the same as or different from each other, when c is 2 or more, two or more R17's are the same as or different from each other, and R14 to R20 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group.

In an exemplary embodiment of the present application, in Formula 2, [Push] is

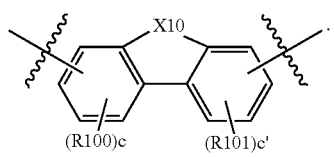

In an exemplary embodiment of the present application, in Formula 2, [Push] is

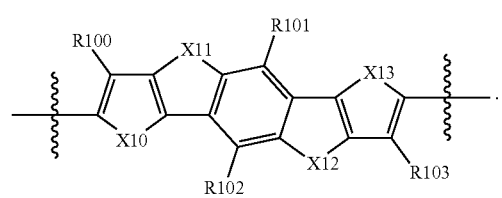

In an exemplary embodiment of the present application, the compound represented by Formula 2 may be represented by the following Formula 2-1 or 2-2.

[Formula 2-1]

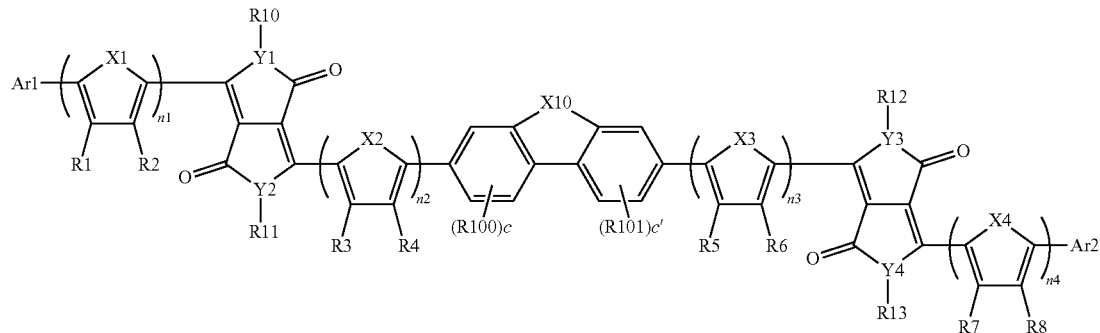

[Formula 2-2]

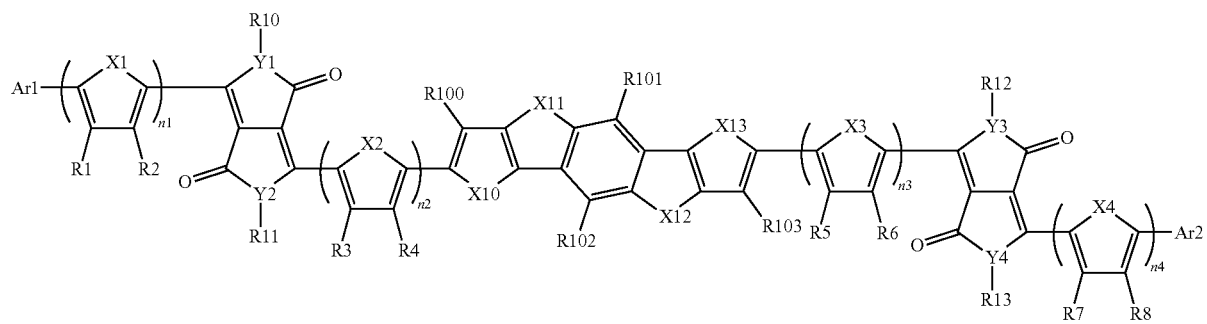

In Formulae 2-1 and 2-2, n1 to n4, X1 to X4, Y1 to Y4, R1 to R8, R10 to R13, Ar1, and Ar2 are the same as those defined in Formula 2, c and c' are each an integer from 1 to 3, when c is 2 or more, two or more R100's are the same as or different from each other, when c' is 2 or more, two or more R101's are the same as or different from each other, X10 to X13 are the same as or different from each other, and are each independently $CR_aR_b$, $NR_a$, O, $SiR_aR_b$, $PR_a$, S, $GeR_aR_b$, Se, or Te, Y10 and Y11 are the same as or different from each other, and are each independently $CR_c$, N, $SiR_c$, P, or $GeR_c$, and $R_a$, $R_b$, $R_c$, and R100 to R103 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group.

In an exemplary embodiment of the present application, the compound represented by Formula 2 may be represented by the following Formula 2-1-1 or 2-1-2.

[Formula 2-1-1]

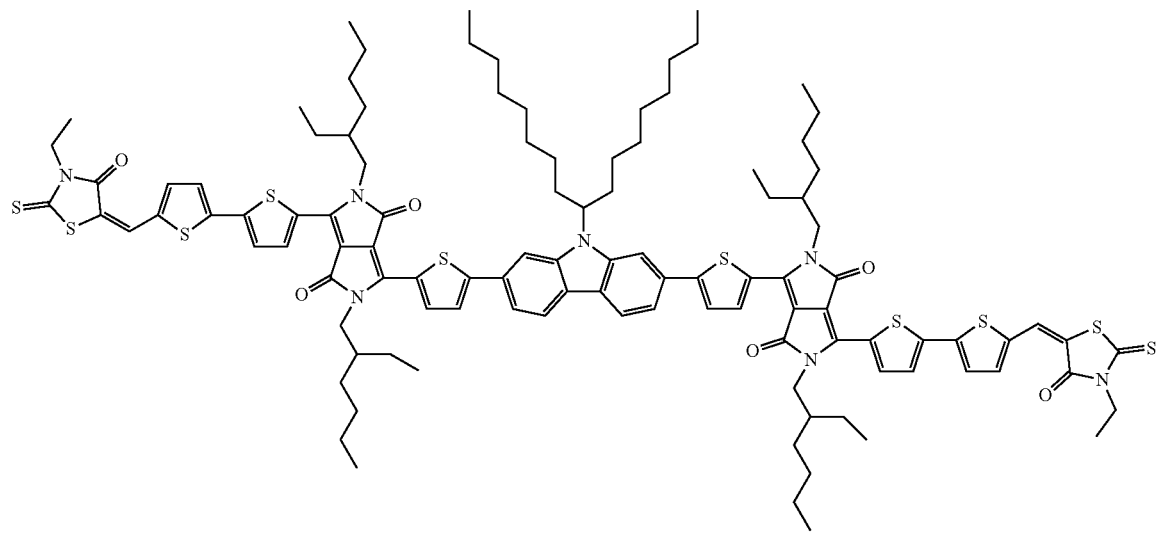

[Formula 2-1-2]

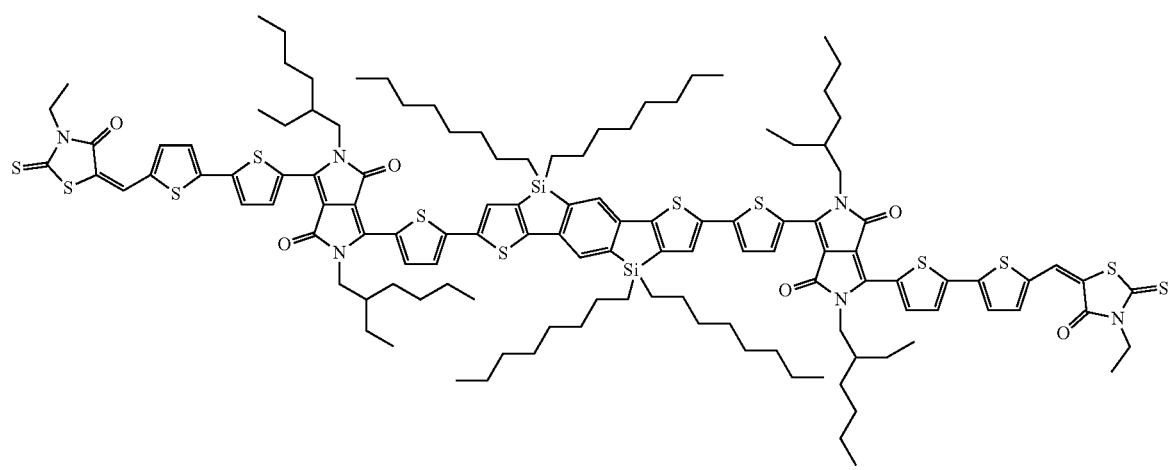

In an exemplary embodiment of the present application, the photoactive layer may comprise an electron donor and an electron acceptor, the electron donor may comprise a polymer compound, and the electron acceptor may comprise a non-fullerene-based compound. In this case, the polymer compound may comprise a polymer comprising: a first unit represented by the following Formula 3; a second unit represented by the following Formula 4; and a third unit represented by the following Formula 5.

[Formula 3]

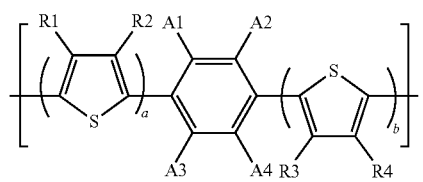

-continued

[Formula 4]

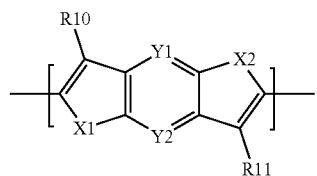

[Formula 5]

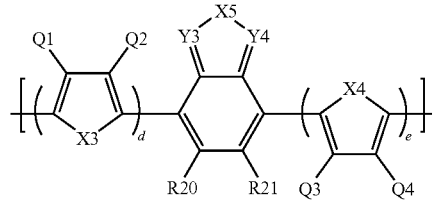

In Formulae 3 to 5, X1 to X5 are the same as or different from each other, and are each independently selected from the group consisting of CRR', NR, O, SiRR', PR, S, GeRR', Se, and Te, Y1 to Y4 are the same as or different from each other, and are each independently selected from the group consisting of CR", N, SiR", P, and GeR", R, R', R", Q1 to Q4, R1 to R4, R10, and R11 are the same as or different from each other, and are each independently hydrogen; deuterium; a halogen group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted amine group; a substituted or unsubstituted aryl group; or a substituted or unsubstituted heterocyclic group, R20 and R21 are the same as or different from each other, and are each independently a substituted or unsubstituted alkoxy group; or a substituted or unsubstituted aryloxy group, a, b, d, and e are each an integer from 0 to 3, when a, b, d, or e is 2 or more, two or more structures in the parenthesis are the same as or different from each other, and A1 to A4 are the same as or different from each other, and are each independently hydrogen, fluorine, or chlorine, and at least one of A1 to A4 is fluorine or chlorine.

In an exemplary embodiment of the present application, the polymer compound comprises the first unit represented by Formula 3.

In an exemplary embodiment of the present application, two groups of A1 to A4 of Formula 3 are fluorine or chlorine, and may be substituted with each other at opposite positions of a benzene ring, that is, at the para position. In this case, fluorine or chlorine of the first unit interacts with an S atom of thiophene of the first unit, or interacts with X1 and/or X2 of the second unit, thereby increasing the planarity of a polymer.

In the present specification, the interaction means that a chemical structure or atoms constituting the chemical structure form a non-covalent bonding interaction, which affects each other by an action other than a covalent bond, and may mean, for example, a chalcogen bond.

In an exemplary embodiment of the present application, the polymer compound minimizes a torsion angle with the backbone of the polymer through a non-covalent bonding interaction within a unit or with another unit adjacent to the unit, thereby improving the planarity of the polymer. Further, the non-covalent bonding interaction improves the π-π stacking to improve the charge mobility due to the delocalization of polaron and exciton, and has an effect in that the packing is facilitated.

Accordingly, when the polymer compound according to an exemplary embodiment of the present application is comprised, a device with high efficiency may be provided because an increase in fill factor (FF) may be induced.

In an exemplary embodiment of the present application, A1 to A4 of Formula 3 are the same as or different from each other, and are each independently hydrogen, fluorine, or chlorine, and at least one of A1 to A4 is fluorine or chlorine. Two groups of A1 to A4 are each fluorine or chlorine, and the two groups may be present at a para position with each other on a benzene ring.

In an exemplary embodiment of the present application, the second unit represented by Formula 4 may be represented by the following Formula 4-1.

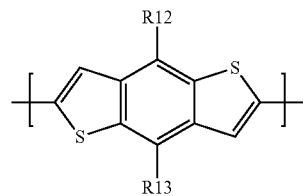

[Formula 4-1]

in Formula 4-1,

R12 and R13 are the same as or different from each other, and are each independently a substituted or unsubstituted alkyl group; a substituted or unsubstituted alkoxy group; a substituted or unsubstituted aryl group; or a substituted or unsubstituted heterocyclic group.

In an exemplary embodiment of the present application, the second unit represented by Formula 4 may be represented by the following Formula 4-2.

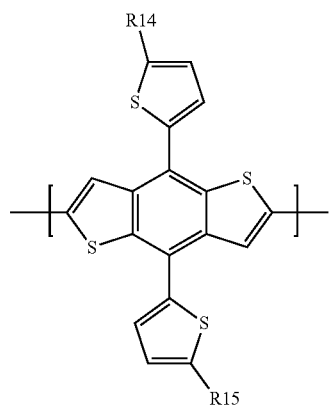

[Formula 4-2]

In Formula 4-2,

R14 and R15 are the same as or different from each other, and are each independently a substituted or unsubstituted alkyl group; or a substituted or unsubstituted alkoxy group.

In an exemplary embodiment of the present application, the third unit represented by Formula 5 may be represented by the following Formula 5-1 or 5-2.

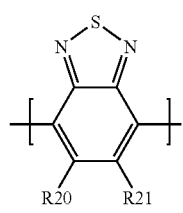

[Formula 5-1]

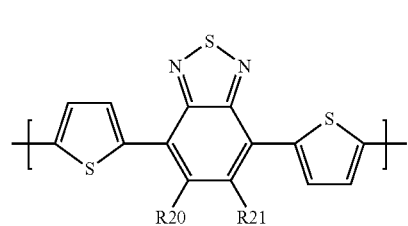

[Formula 5-2]

In Formulae 5-1 and 5-2,

R20 and R21 are the same as those defined in Formula 5.

In an exemplary embodiment of the present application, the polymer compound may comprise a unit represented by the following Formula 6.

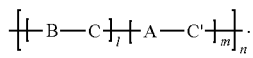

[Formula 6]

In Formula 6,
l is a mole fraction, and a real number of 0<l<1,
m is a mole fraction, and a real number of 0<m<1,
l+m=1,
A is the first unit represented by Formula 1,
B is the second unit represented by Formula 2,
C and C' are the same as or different from each other, and are each independently the third unit represented by Formula 3, and
n is a repeating number of the unit, and an integer from 1 to 10,000.

In an exemplary embodiment of the present application, A of Formula 6 is the first unit represented by Formula 3, and a and b are each independently an integer from 1 to 3.

Further, in an exemplary embodiment of the present application, A of Formula 6 is the first unit represented by Formula 3, and a and b are each 1.

In an exemplary embodiment of the present application, B of Formula 6 is the second unit represented by Formula 4-2.

In an exemplary embodiment of the present application, C and C' of Formula 6 are the third unit represented by Formula 5-1.

In addition, in an exemplary embodiment of the present application, the third unit represented by Formula 5 may comprise R20 and R21 to form a planar structure through the interactions of O atoms of R20 and R21; fluorine or chlorine of the first unit represented by Formula 3; and an S atom of the second unit represented by Formula 4.

In an exemplary embodiment of the present application, the polymer compound may comprise a unit represented by the following Formula 7.

[Formula 7]

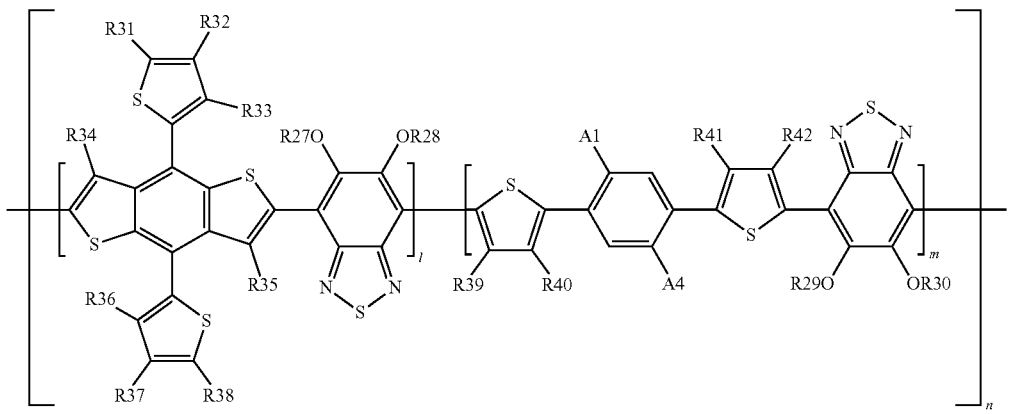

In Formula 7,
R27 to R30 are the same as or different from each other, and are each independently a substituted or unsubstituted alkyl group; or a substituted or unsubstituted aryl group,
R31 to R42 are the same as or different from each other, and are each independently hydrogen; or a substituted or unsubstituted alkyl group,
A1 and A4 are the same as those defined in Formula 1,
l is a mole fraction, and a real number of 0<l<1,
m is a mole fraction, and a real number of 0<m<1,
l+m=1, and
n is a repeating number of the unit, and an integer from 1 to 10,000.

In an exemplary embodiment of the present application, the polymer compound may comprise a unit represented by the following Formula 7-1.

[Formula 7-1]

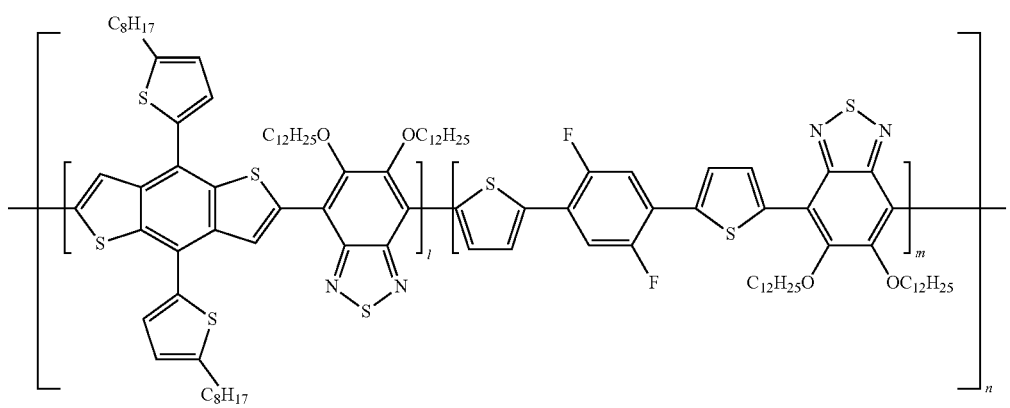

In an exemplary embodiment of the present application, the polymer compound may comprise a unit represented by the following Formula 8 or 9.

stituted aryl group. In an exemplary embodiment of the present application, the end group of the polymer compound is a 4-(trifluoromethyl)phenyl group.

[Formula 8]

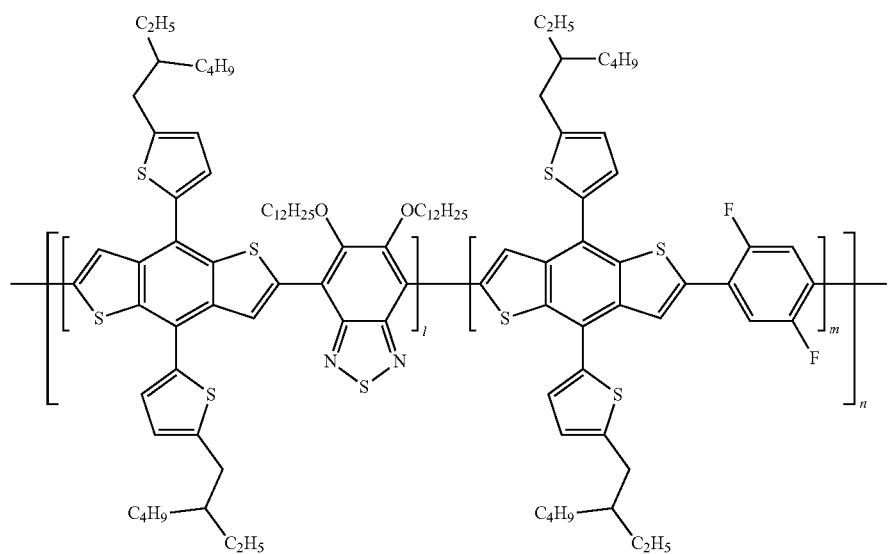

[Formula 9]

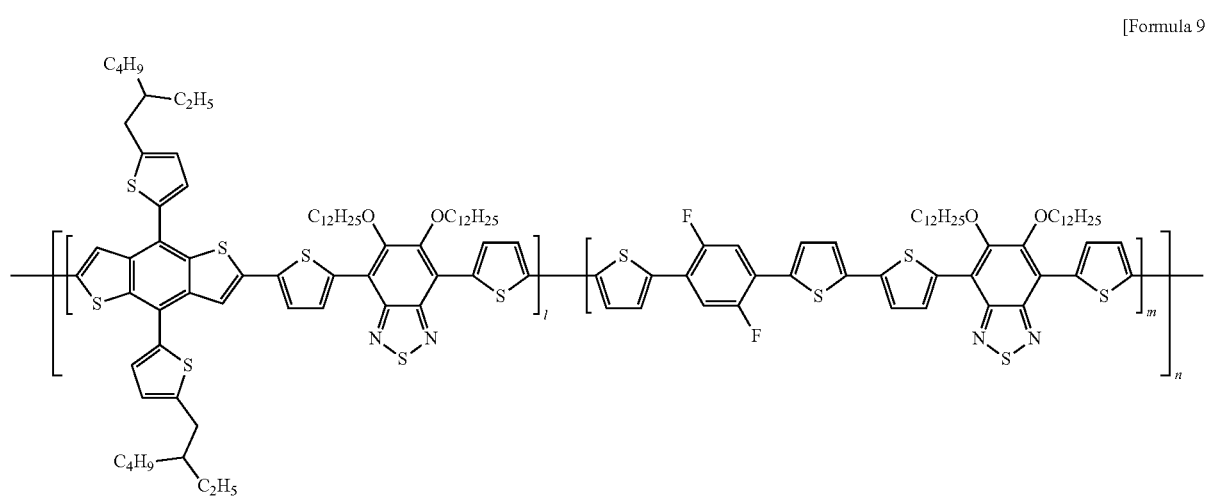

In Formulae 7-1, 8, and 9, l, m, and n are the same as those defined in Formula 7.

In an exemplary embodiment of the present application, the polymer compound is a random polymer. In the case of the random polymer, there is an economic effect in which time and costs are reduced in the process of manufacturing a device due to the improved solubility.

In an exemplary embodiment of the present application, an end group of the polymer compound is a substituted or unsubstituted heterocyclic group or a substituted or unsub- In an exemplary embodiment of the present application, the end group of the polymer compound is a bromothiophene group. In another exemplary embodiment, the end group of the polymer compound is a trifluoro-benzene group.

In an exemplary embodiment of the present application, the non-fullerene-based compound may be represented by the following Formula A.

[Formula A]

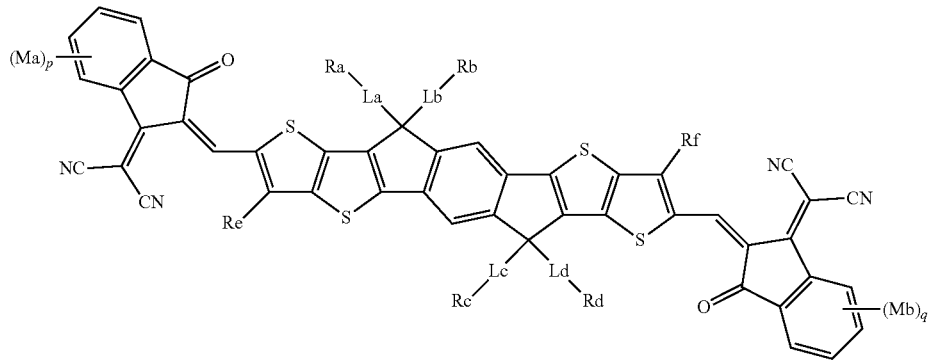

In Formula A,

Ra to Rf are the same as or different from each other, and are each independently hydrogen; or a substituted or unsubstituted alkyl group, La to Ld are the same as or different from each other, and each independently a substituted or unsubstituted arylene group; or a substituted or unsubstituted divalent heterocyclic group, Ma and Mb are the same as or different from each other, and are each independently hydrogen; a halogen group; or a substituted or unsubstituted alkyl group, p and q are each independently an integer from 0 to 2, and when p or q is 2, structures in the parenthesis are the same as each other.

In an exemplary embodiment of the present application, the compound represented by Formula A may be any one of the following Formulae A-1 to A-5.

[Formula A-1]

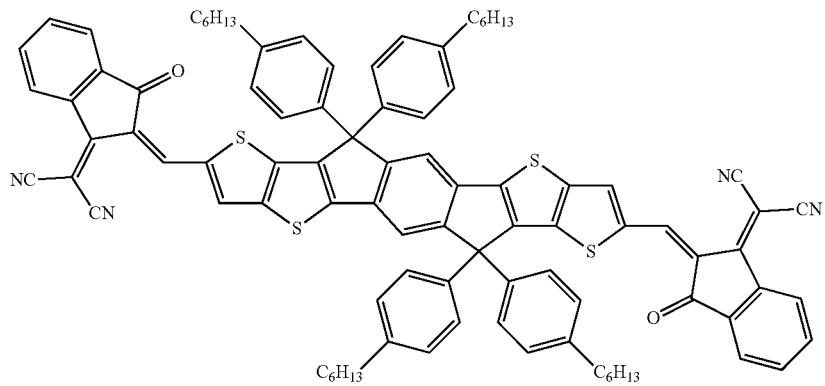

[Formula A-2]

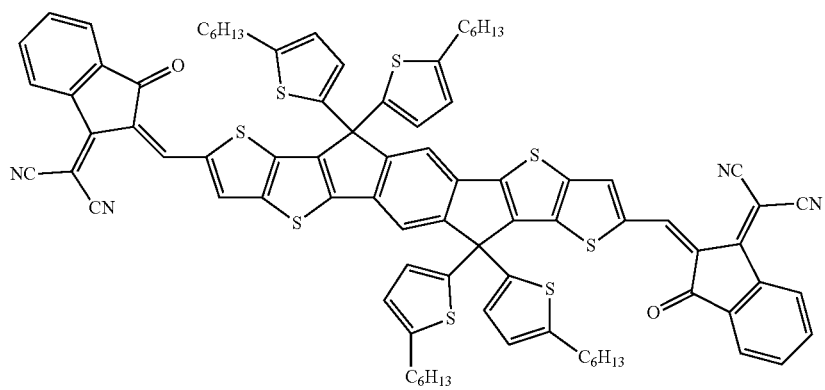

[Formula A-3]

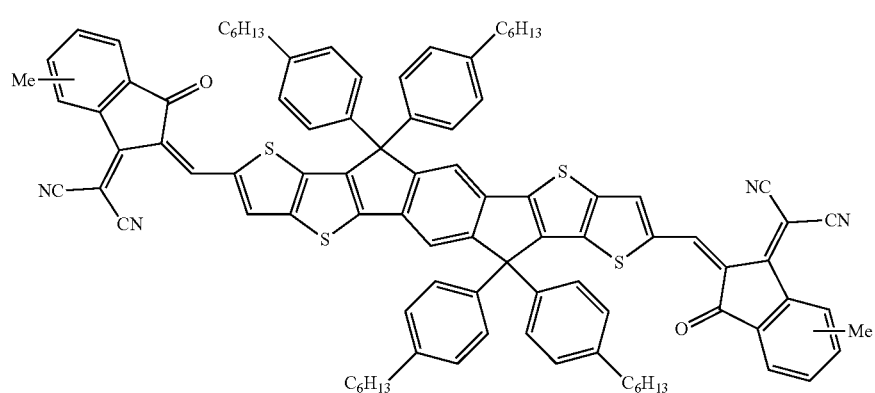

[Formula A-4]

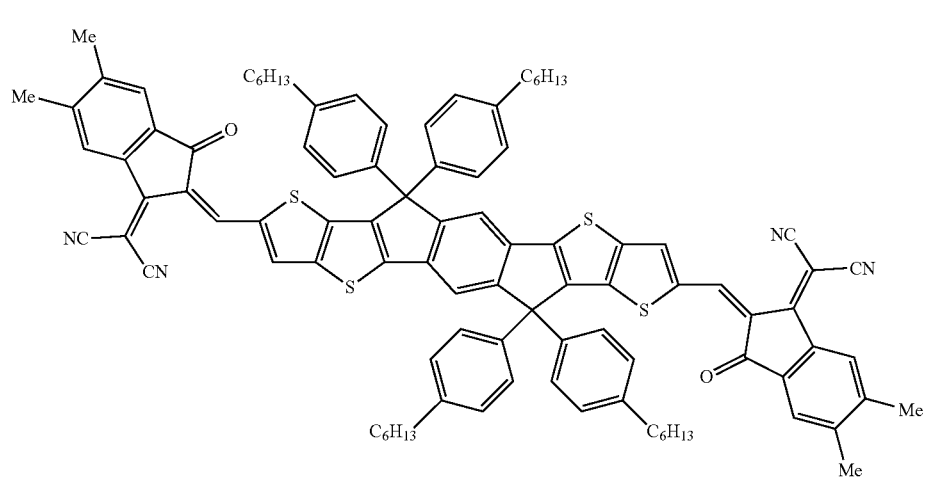

[Formula A-5]

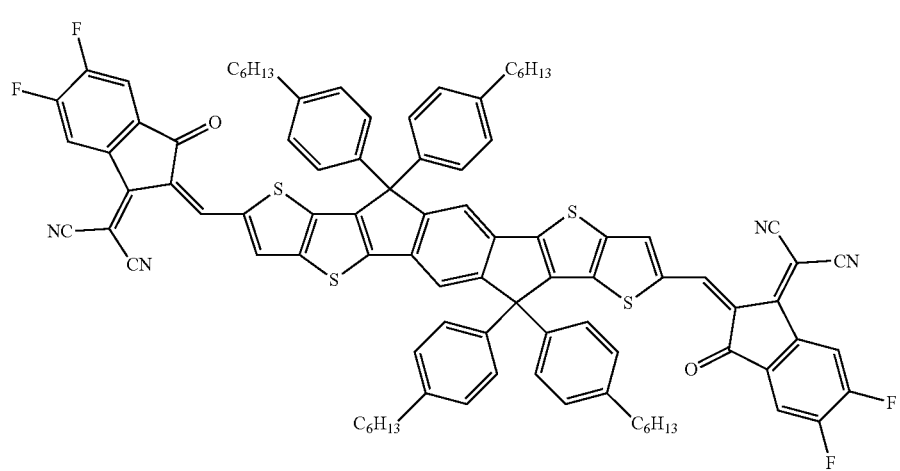

In the present specification, Me means a methyl group.

In an exemplary embodiment of the present application, the photoactive layer may comprise an electron donor and an electron acceptor, the electron donor may comprise a polymer compound, and the electron acceptor may comprise a fullerene-based compound. In this case, the polymer compound may comprise a polymer comprising: a first unit represented by the following Formula 10; a second unit represented by the following Formula 11; and a third unit represented by the following Formula 12.

[Formula 10]

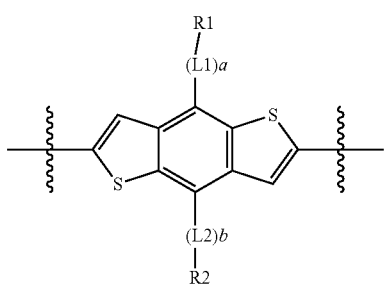

[Formula 11]

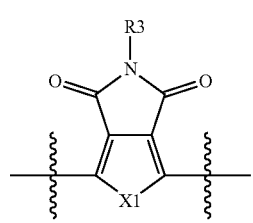

[Formula 12]

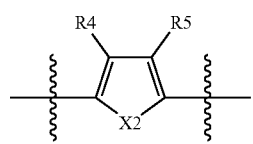

In Formulae 10 to 12, a and b are each an integer from 1 to 3, when a is 2 or more, two or more L1's are the same as or different from each other, when b is 2 or more, two or more L2's are the same as or different from each other, L1 and L2 are the same as or different from each other, and each independently have a conjugated structure, R1 and R2 are the same as or different from each other, and are each independently, as a substituent to be substituted in the conjugated structure of L1 and L2, one or two or more selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group comprising one or more of N, O, and S atoms, X1 and X2 are the same as or different from each other, and are each independently CRR', NR, O, SiRR', PR, S, GeRR_', Se or Te, and R, R' and R3 to R5 are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group comprising one or more of N, O, and S atoms.

In an exemplary embodiment of the present application, the polymer compound may comprise a unit represented by the following Formula 13.

[Formula 13]

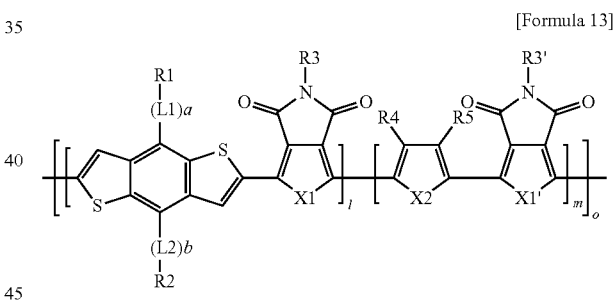

In Formula 4, a, b, L1, L2, X1, X2, and R1 to R5 are the same as those defined in Formulae 10 to 12, X1' is the same as or different from X1, and is each independently the same as the definition of X1, R3' is the same as or different from R3, and is each independently the same as the definition of R3, l is a mole fraction, and 0<l<1, m is a mole fraction, and 0<m<1, l+m=1, and o is an integer with 0<o<1,000.

In an exemplary embodiment of the present application, the polymer compound may be represented by any one of the following Formulae 13-1 to 13-5.

[Formula 13-1]
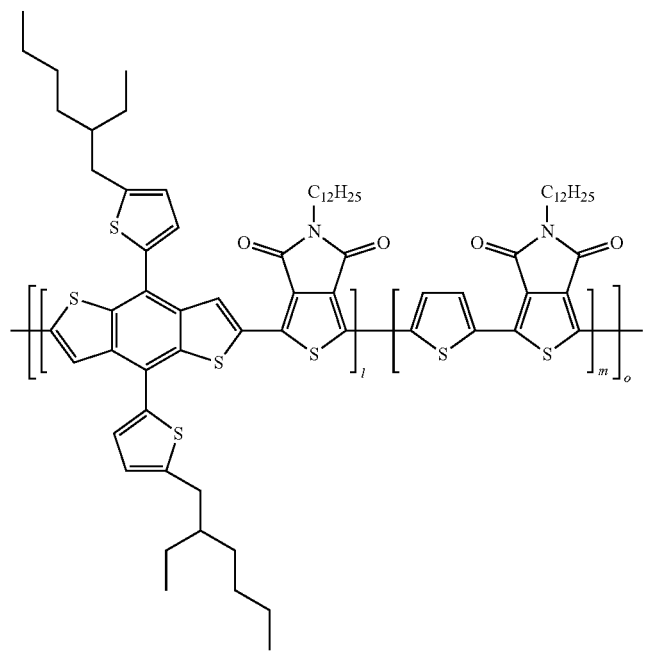
[Formula 13-2]
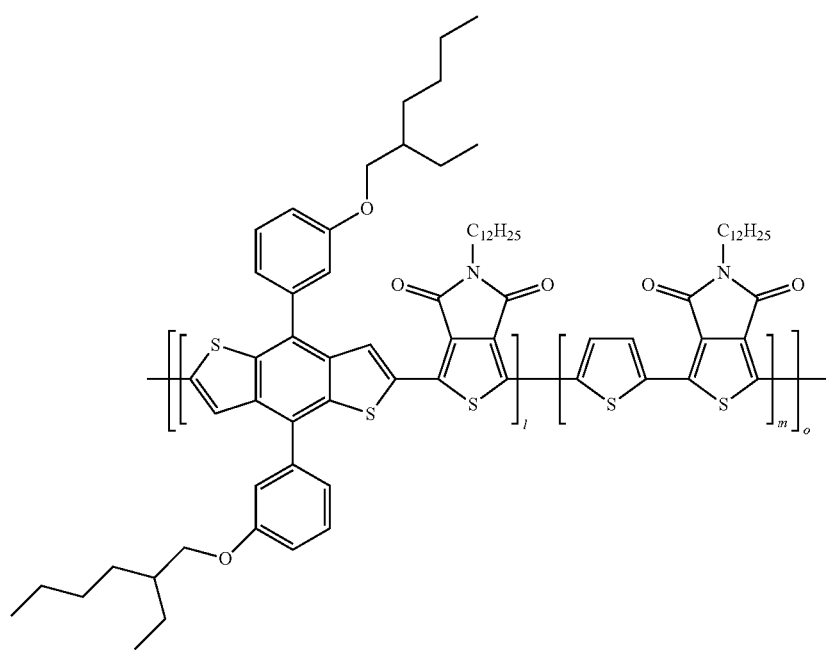

-continued

[Formula 13-3]

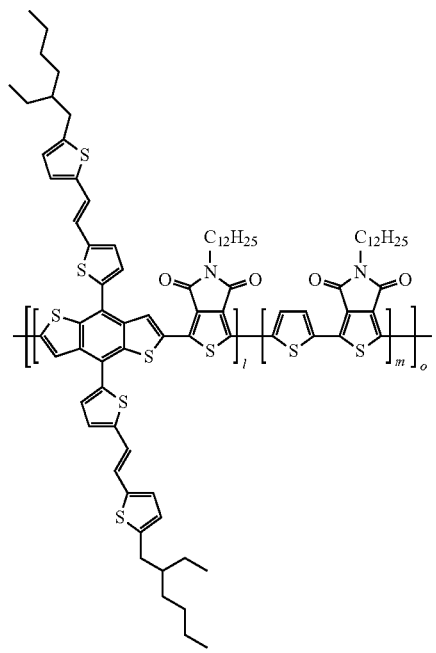

[Formula 13-4]

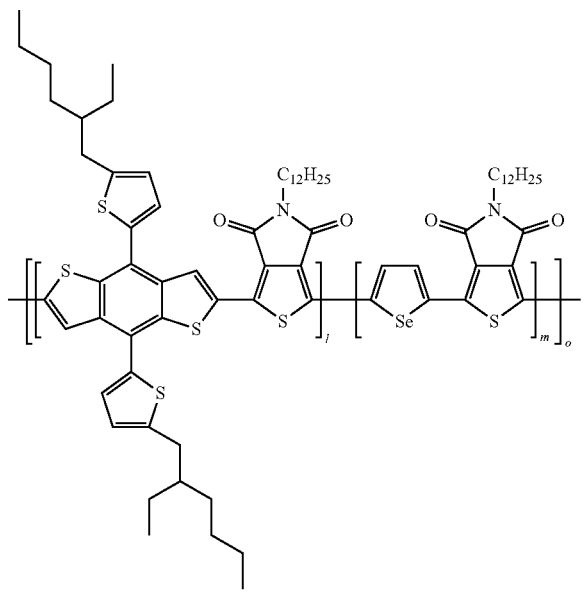

[Formula 13-5]

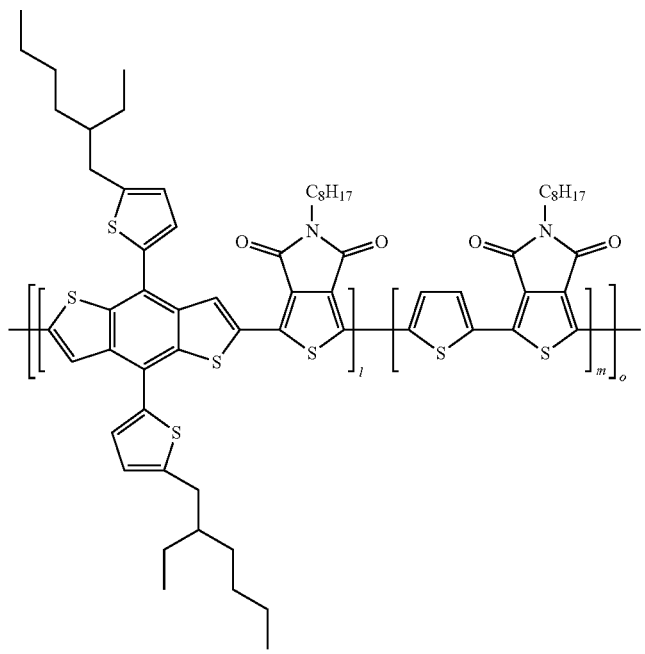

In Formulae 13-1 to 13-5, the definitions of l, m, and o are the same as those defined above.

In an exemplary embodiment of the present application, the photoactive layer may comprise an electron donor and an electron acceptor, the electron donor may comprise a polymer compound, and the electron acceptor may comprise a fullerene-based compound. In this case, the polymer compound may comprise a polymer comprising: a first unit represented by the following Formula 14; and a second unit represented by the following Formula 15.

[Formula 14]

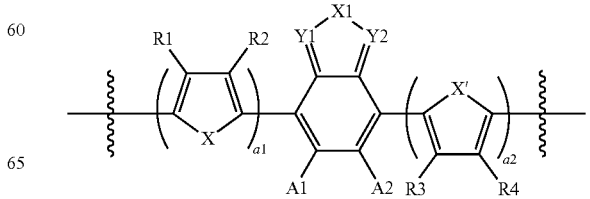

[Formula 15]

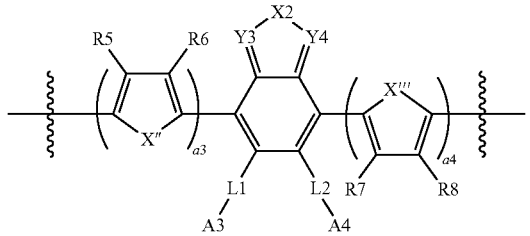

In Formulae 14 and 15,

X1 and X2 are the same as or different from each other, and are each independently CRR', NR, O, SiRR', PR, S, GeRR', Se, or Te, Y1 to Y4 are the same as or different from each other, and are each independently CR", N, SIR", P, or GeR", X, X', X", and X'" are the same as or different from each other, and are each independently S or Se, A1 and A2 are the same as or different from each other, and are each independently hydrogen; or fluorine, L1 and L2 are the same as or different from each other, and are each independently a direct bond; O; or S, A3 and A4 are the same as or different from each other, and are each independently hydrogen; fluorine; a substituted or unsubstituted alkyl group; a substituted or unsubstituted aryl group; or a substituted or unsubstituted heterocyclic group, at least one of L1 and L2 is O or S, R, R', R", and R1 to R8 are the same as or different from each other, and are each independently hydrogen; deuterium; a halogen group; a hydroxyl group; a substituted or unsubstituted alkyl group; a substituted or unsubstituted alkoxy group; a substituted or unsubstituted aryl group; or a substituted or unsubstituted heterocyclic group, and a1 to a4 are each an integer of 0 or 1.

In an exemplary embodiment of the present application, the polymer compound may be represented by any one of the following Formulae 16-1 to 16-17.

[Formula 16-1]

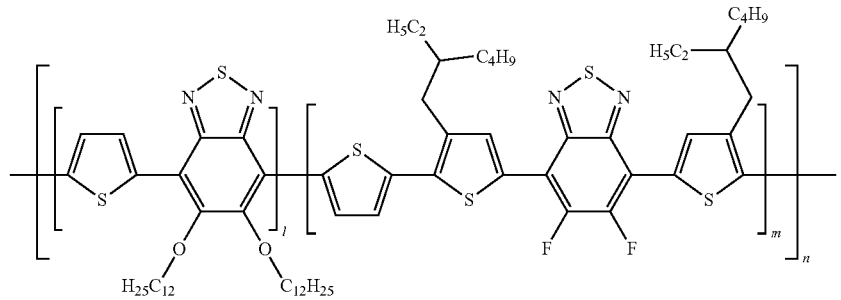

[Formula 16-2]

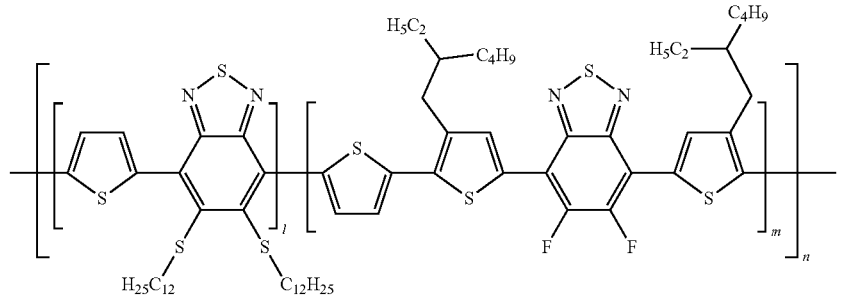

[Formula 16-3]

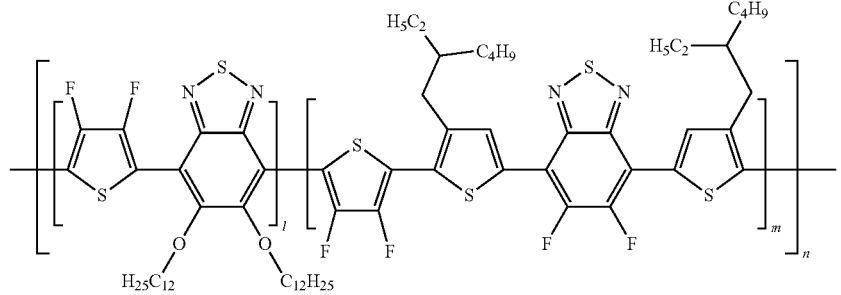

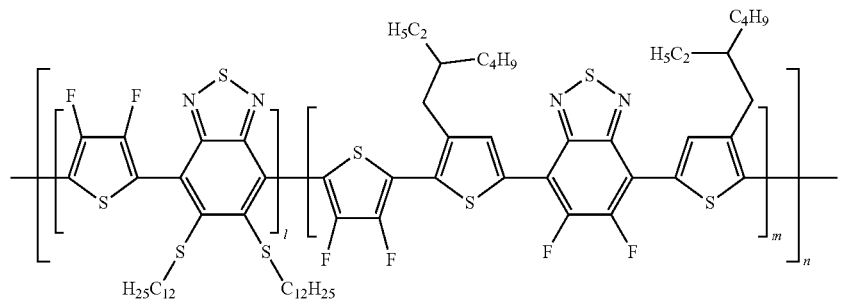
[Formula 16-4]
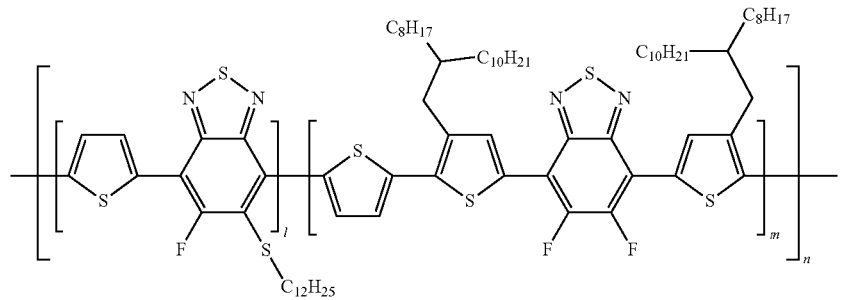
[Formula 16-5]
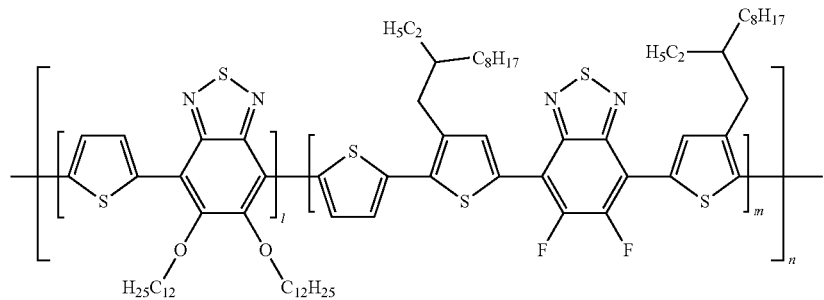
[Formula 16-6]
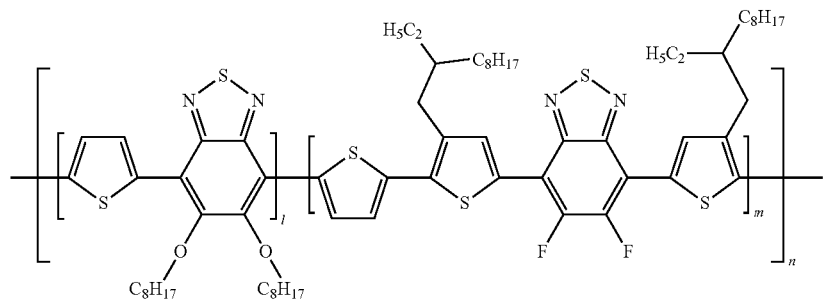
[Formula 16-7]
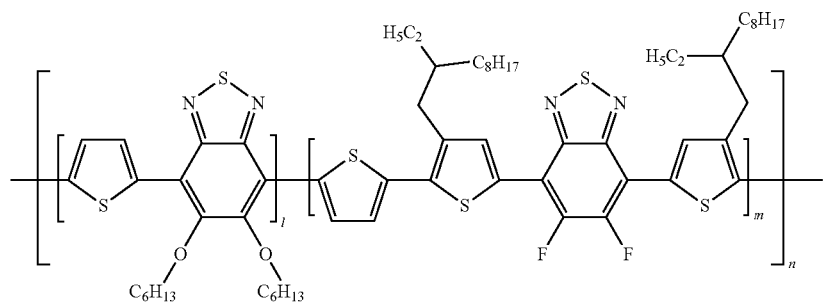
[Formula 16-8]

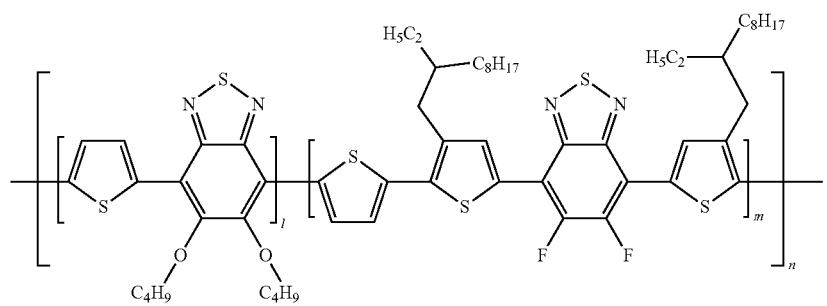
[Formula 16-9]
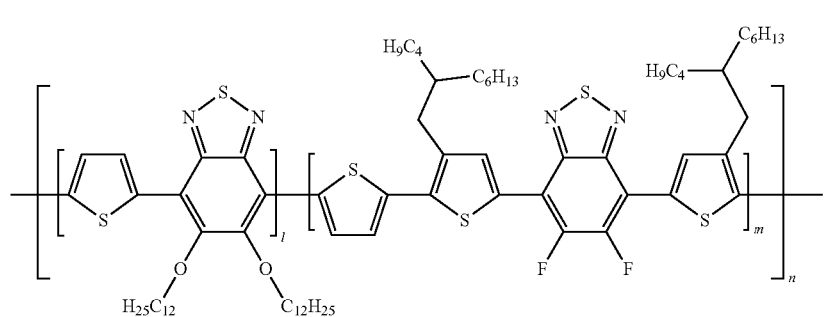
[Formula 16-10]
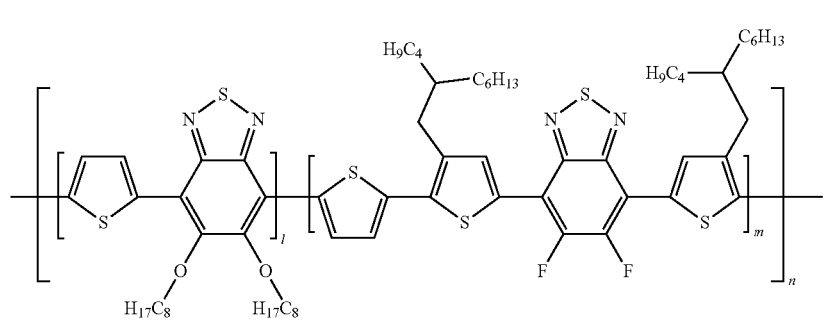
[Formula 16-11]
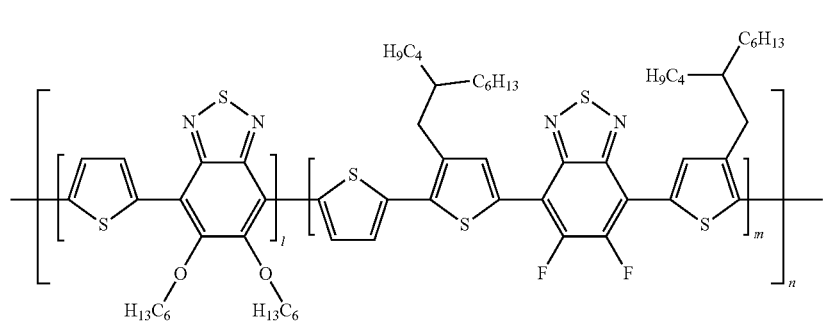
[Formula 16-12]
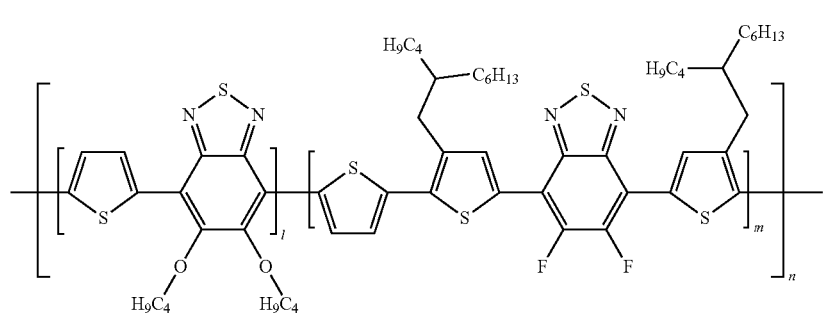
[Formula 16-13]

-continued

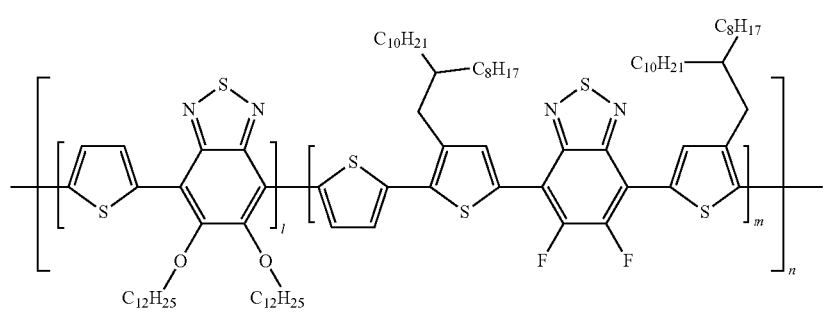

[Formula 16-14]

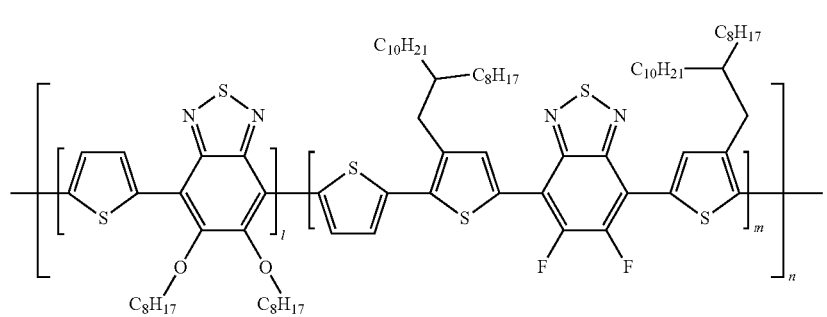

[Formula 16-15]

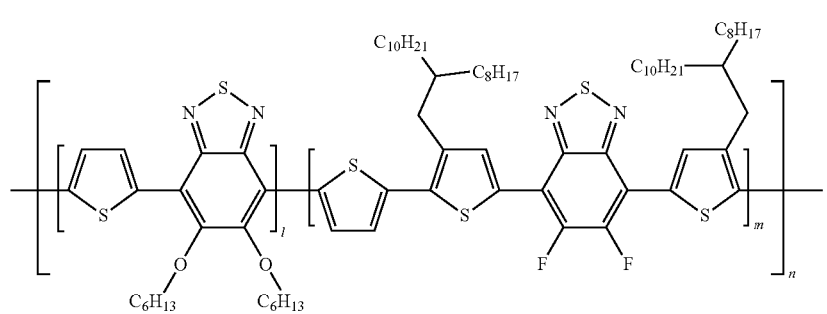

[Formula 16-16]

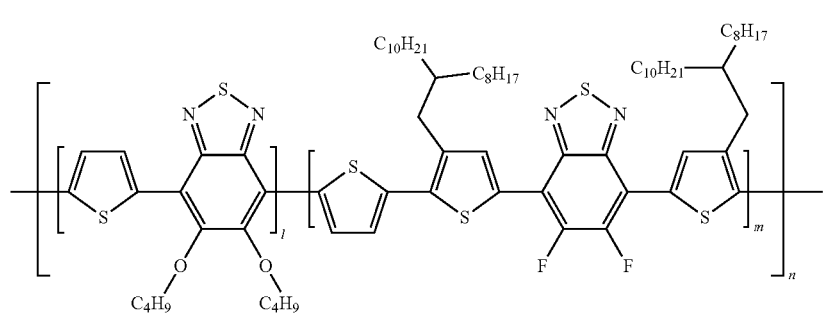

[Formula 16-17]

In Formulae 16-1 to 16-17,
l is a mole fraction and $0<l<1$,
m is a mole fraction and $0<m<1$,
l+m=1, and
n is a repeating number of the unit, and an integer from 1 to 10,000.

In an exemplary embodiment of the present application, the case where the electron donor comprises a polymer compound and the electron acceptor comprises a non-fullerene-based compound may have an effect in that the organic solar cell has better energy conversion efficiency, as compared to the case where the electron donor comprises a polymer compound and the electron acceptor comprises a fullerene-based compound.

In an exemplary embodiment of the present application, the case where the electron donor comprises a single molecular compound and the electron acceptor comprises a fullerene-based compound may have an effect in that the organic solar cell has better energy conversion efficiency, as compared to the case where the electron donor comprises a polymer compound and the electron acceptor comprises a fullerene-based compound.

Examples of the substituents will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or more substituents selected from the group consisting of deuterium; a halogen group; a nitrile group; a nitro group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted aryl group; and a substituted or unsubstituted heterocyclic group or being substituted with a substituent to which two or more substituents are linked among the substituents exemplified above, or having no substituent. For example, "the substituent to which two or more substituents are linked" may be a biphenyl group. That is, the biphenyl group may also be an aryl group, and may be interpreted as a substituent to which two phenyl groups are linked.

In the present specification, examples of a halogen group comprise fluorine, chlorine, bromine or iodine.

In the present specification, the alkyl group may be straight-chained or branched, and the number of carbon atoms thereof is not particularly limited, but is preferably 1 to 50. Specific examples thereof comprise methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylhexyl, 4-methylhexyl, 5-methylhexyl, and the like, but are not limited thereto.

In the present specification, a cycloalkyl group is not particularly limited, but the number of carbon atoms thereof is preferably 3 to 60, and specific examples thereof comprise cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chained, branched, or cyclic. The number of carbon atoms of the alkoxy group is not particularly limited, but is preferably 1 to 20. Specific examples thereof comprise methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight-chained or branched, and the number of carbon atoms thereof is not particularly limited, but is preferably 2 to 40. Specific examples thereof comprise vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenyl-vinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, the number of carbon atoms of an amine group is not particularly limited, but is preferably 1 to 30. The amine group may be substituted with an aryl group, an alkyl group, an arylalkyl group, a heterocyclic group, and the like in the N atom, and specific examples of the amine group comprise a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, when the aryl group is a monocyclic aryl group, the number of carbon atoms thereof is not particularly limited, but is preferably 6 to 25. Specific examples of the monocyclic aryl group comprise a phenyl group, a biphenyl group, a terphenyl group, and the like, but are not limited thereto.

In the present specification, when the aryl group is a polycyclic aryl group, the number of carbon atoms thereof is not particularly limited, but is preferably 10 to 24. Specific examples of the polycyclic aryl group comprise a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

In the present specification, an arylene group means a group having two bonding positions in an aryl group, that is, a divalent group. The above-described description on the aryl group may be applied to the arylene group, except for a divalent arylene group.

In the present specification, a heterocyclic group comprises one or more atoms other than carbon, that is, one or more heteroatoms, and specifically, the heteroatom may comprise one or more atoms selected from the group consisting of O, N, Se, S, and the like. The number of carbon atoms of the heterocyclic group is not particularly limited, but is preferably 2 to 60. Examples of the heterocyclic group comprise a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a phenothiazinyl group, a dibenzofuranyl group, and the like, but are not limited thereto.

In the present specification, an aryl group of an aryloxy group is the same as the above-described examples of the aryl group. Specifically, examples of the aryloxy group comprise phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, but are not limited thereto.

According to an exemplary embodiment of the present application, the photoactive layer may be formed by using a solution comprising a photoactive material and a solvent.

According to an exemplary embodiment of the present application, the solvent may be one or a mixed solvent of two or more selected from the group consisting of chloroform, chlorobenzene, orthodichlorobenzene, xylene, toluene, cyclohexane, and 2-methylanisole.

According to an exemplary embodiment of the present application, the solvent may further comprise one or two or more additives selected from the group consisting of 1,8-diiodooctane (DIO), octane dithiol, diphenyl ether, trichlorobenzene, and 1-chloronaphthalene.

In an exemplary embodiment of the present application, the photoactive layer may further comprise an additive. In an exemplary embodiment of the present application, the additive has a molecular weight of 50 g/mol to 1,000 g/mol. The additive may be an organic material having a boiling point of 30° C. to 300° C. The organic material means a material comprising at least one or more carbon atoms.

In an organic solar cell, for smoothly separating excitons and effectively transporting separated electric charges, the interface between an electron donor and an electron acceptor needs to be maximally increased, but it is required to induce an improvement in morphology by securing a continuous channel of the electron donor and the electron acceptor through a suitable phase separation.

According to an exemplary embodiment of the present application, the additive may be introduced into an active layer, thereby inducing a selective solubility of an electron donor and an electron acceptor for the additive and an effective phase separation induced by a difference in a boiling point between the solvent and the additive. Further, the morphology is fixed by cross-linking an electron acceptor or an electron donor, so that the phase separation may be allowed not to occur, and the morphology may be controlled by changing the molecular structure of the electron donor.

In an exemplary embodiment of the present application, the photoactive layer may have a thickness of 150 nm or less, 100 nm or less, and 80 nm or less. Furthermore, the photoactive layer may have a thickness of 40 nm or more, and 50 nm or more.

In an exemplary embodiment of the present application, the substrate may be a transparent substrate, and the transparent substrate is not particularly limited, but is preferably a transparent substrate having a light transmittance of 50% or more, preferably 75% or more. Specifically, as the transparent substrate, glass may also be used, and a plastic substrate or a plastic film may be used. As the plastic substrate or film, materials known in the art may be used, and for example, it is possible to use a plastic substrate or film formed of one or more resins selected from polyacryl-based, polyurethane-based, polyester-based, polyepoxy-based, polyolefin-based, polycarbonate-based, and cellulose-based materials. More specifically, a film having a visible light transmittance of 80% or more, such as polyethylene terephthalate (PET), polyvinyl butyral (PVB), polyethylene naphthalate (PEN), polyethersulfone (PES), polycarbonate (PC), and acetyl celluloid, is preferred.

In an exemplary embodiment of the present application, when the organic solar cell accepts a photon from an external light source, an electron and a hole are generated between an electron donor and an electron acceptor. The generated hole is transported to a positive electrode through an electron donor layer.

In an exemplary embodiment of the present application, the organic solar cell may further comprise a hole transport layer, a hole injection layer, or a layer which transports and injects holes simultaneously. Further, in an exemplary embodiment of the present application, the organic solar cell may further comprise an electron injection layer, an electron transport layer, or a layer which injects and transports electrons simultaneously.

The organic solar cell according to an exemplary embodiment of the present application is schematically illustrated in the following FIG. 1.

In an exemplary embodiment of the present application, the first electrode is an anode, and the second electrode is a cathode. In addition, in an exemplary embodiment of the present application, the first electrode is a cathode, and the second electrode is an anode.

In an exemplary embodiment of the present application, in the organic solar cell, a cathode, a photoactive layer, and an anode may be arranged in this order, and an anode, a photoactive layer, and a cathode may be arranged in this order, but the arrangement order is not limited thereto.

In an exemplary embodiment of the present application, in the organic solar cell, an anode, a hole transport layer, a photoactive layer, an electron transport layer, and a cathode may also be arranged in this order, and a cathode, an electron transport layer, a photoactive layer, a hole transport layer, and an anode may also be arranged in this order, but the arrangement order is not limited thereto.

In an exemplary embodiment of the present application, the organic solar cell has a normal structure. The normal structure may mean that an anode is formed on a substrate. Specifically, according to an exemplary embodiment of the present specification, when the organic solar cell has a normal structure, a first electrode formed on a substrate may be an anode.

In an exemplary embodiment of the present application, the organic solar cell has an inverted structure. The inverted structure may mean that a cathode is formed on a substrate. Specifically, according to an exemplary embodiment of the present specification, when the organic solar cell has an inverted structure, a first electrode formed on a substrate may be a cathode.

In an exemplary embodiment of the present application, the organic solar cell has a tandem structure. In this case, the organic solar cell may comprise two or more photoactive layers. The organic solar cell according to an exemplary embodiment of the present application may have one or two or more photoactive layers.

In an exemplary embodiment of the present application, a buffer layer may be provided between a photoactive layer and a hole transport layer, or between a photoactive layer and an electron transport layer. In this case, a hole injection layer may be further provided between an anode and the hole transport layer. Further, an electron injection layer may be further provided between a cathode and the electron transport layer.

In an exemplary embodiment of the present application, the electron donor and the electron acceptor constitute a bulk heterojunction (BHJ). The bulk heterojunction means that an electron donor and an electron acceptor are mixed with each other in a photoactive layer.

In an exemplary embodiment of the present application, the photoactive layer may have a bilayer thin film structure comprising an n-type organic material layer and a p-type organic material layer.

In an exemplary embodiment of the present application, the anode electrode may be made of a material which is transparent and has excellent conductivity, but is not limited thereto. Examples thereof comprise: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$: Sb; a conductive polymer such as poly(3-methylthiophene), poly

[3,4-(ethylene-1,2-dioxy)thiophene] (PEDOT), polypyrrole, and polyaniline; and the like, but are not limited thereto.

A method of forming the anode electrode is not particularly limited, but the anode electrode may be formed, for example, by being applied on one surface of a substrate using a method such as sputtering, e-beam, thermal deposition, spin coating, screen printing, inkjet printing, doctor blade, or gravure printing, or by being coated in the form of a film.

When the anode electrode is formed on a substrate, the anode electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100° C. to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film may be easily formed on the anode electrode, and the quality of the thin film may also be improved.

Examples of a pre-treatment technology for the anode electrode comprise a) a surface oxidation method using a parallel flat plate-type discharge, b) a method of oxidizing a surface through ozone produced by using UV rays in a vacuum state, c) an oxidation method using oxygen radicals produced by plasma, and the like.

One of the methods may be selected according to the state of the anode electrode or the substrate. However, commonly in all the methods, it is preferred to prevent oxygen from being separated from the surface of the anode electrode or the substrate, and maximally inhibit moisture and organic materials from remaining. In this case, it is possible to maximize a substantial effect of the pre-treatment.

As a specific example, it is possible to use a method of oxidizing the surface through ozone produced by using UV. In this case, a patterned ITO substrate after being ultrasonically cleaned is baked on a hot plate and dried well, and then introduced into a chamber, and the patterned ITO substrate may be cleaned by ozone generated by allowing an oxygen gas to react with UV light by operating a UV lamp.

However, the surface modification method of the patterned ITO substrate in the present application need not be particularly limited, and any method may be used as long as the method is a method of oxidizing a substrate.

The cathode electrode may be a metal having a low work function, but is not limited thereto. Specific examples thereof comprise: a metal such as magnesium, calcium, sodium, potassium, titanium, indium, yttrium, lithium, gadolinium, aluminum, silver, tin, and lead, or an alloy thereof; and a multi-layer structured material, such as LiF/Al, LiO$_2$/Al, LiF/Fe, Al:Li, Al:BaF$_2$, and Al:BaF$_2$:Ba, but are not limited thereto.

The cathode electrode may be deposited and formed in a thermal depositor showing a vacuum degree of $5\times10^{-7}$ ton or less, but a method of forming the cathode electrode is not limited to this method.

The hole transport layer and/or electron transport layer materials serve to efficiently transfer electrons and holes separated from a photoactive layer to the electrode, and the materials are not particularly limited.

The hole transport layer material may be poly(3,4-ethylenedioxythiophene)-poly(styrenesulfonate)) (PEDOT:PSS); molybdenum oxide (MoO$_x$); vanadium oxide (V$_2$O$_5$); nickel oxide (NiO); and tungsten oxide (WO$_x$); and the like, but is not limited thereto.

The electron transport layer material may be electron-extracting metal oxides, and specific examples thereof comprise: metal complexes of 8-hydroxyquinoline; complexes comprising Alq$_3$; metal complexes comprising Liq; LiF; Ca; titanium oxide (TiO$_x$); zinc oxide (ZnO); and cesium carbonate (Cs$_2$CO$_3$), poly(ethylene imine) (PEI); and the like, but are not limited thereto.

The present application provides an organic solar cell manufactured by the above-described method for manufacturing an organic solar cell.

The organic solar cell according to an exemplary embodiment of the present application has a characteristic in that the energy conversion efficiency is excellent. A method for measuring the energy conversion efficiency will be described below.

The energy conversion efficiency of the organic solar cell is a value obtained by dividing a product of the open circuit voltage (Voc), the short circuit current (Jsc), and the charge rate (FF) by the intensity of light to be irradiated, and may be calculated by Mathematical Formula 1 described below.

$$\eta = FF \times [Jsc \times Voc/(\text{intensity of light to be irradiated})] \quad \text{[Mathematical Formula 1]}$$

(in the formula, FF is a charge rate (fill factor), Jsc is an optical short circuit current density, and Voc is an optical open circuit voltage)

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

EXAMPLES

Example 1

1) Preparation of Composite Solution A composite solution was prepared by dissolving a compound represented by the following Compound 1 and (6,6)-phenyl-C61-butyric acid methyl ester (PCBM) at a mass ratio of 1:2 in chlorobenzene (CB). In this case, the concentration of the composite solution of the compound and PCBM was adjusted to 3 wt %.

2) Preparation of Substrate

In order to manufacture an organic solar cell having a structure of ITO/ZnO/a photoactive layer/MoO$_3$/Ag, a glass substrate (117 cm$^2$) coated with ITO as a strip type was ultrasonically washed by using distilled water, acetone, and 2-propanol, and the ITO surface was treated with ozone for 10 minutes.

3) Formation of First Electrode

ZnO was bar-coated to a thickness of 45 nm on the substrate, and the substrate was heat-treated at 100° C. for 10 minutes.

4) Formation of Photoactive Layer

The composite solution was coated on the first electrode by using bar-coating.

5) Drying of Photoactive Layer

A laminate coated with the composite solution was dried with a wind force of 0.01 Mpa to 0.07 Mpa. More specifically, the drying was performed by using equipment (air regulator in the following FIG. 2) that blows uniformly the wind with a wind force of 0.01 Mpa to 0.07 Mpa at a height of 1 cm to 3 cm from the surface of the photoactive layer of the laminate. In this case, the temperature was 22° C. to 27° C., and the humidity was 20% to 35%.

6) Formation of Second Electrode

Thereafter, $MoO_3$ was deposited to 10 nm at a rate of 0.5 Å/s by using a thermal evaporator under a vacuum of $3\times10^{-8}$ ton, and Ag was deposited to a thickness of 100 nm at a rate of 1 Å/s, thereby manufacturing a final organic solar cell.

[Compound 1]

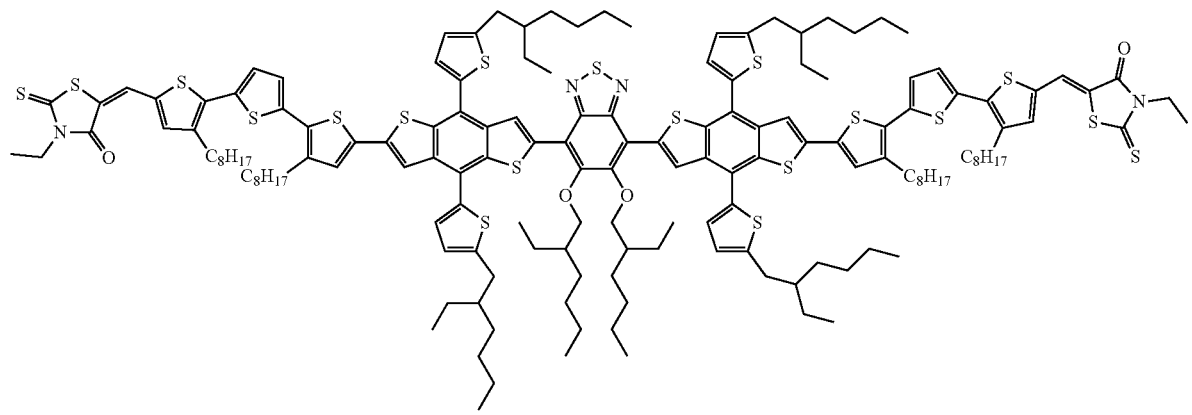

Example 2

An organic solar cell was manufactured in the same manner as in Example 1, except that the following Compound 2 was used instead of Compound 1 in Example 1.

[Compound 2]

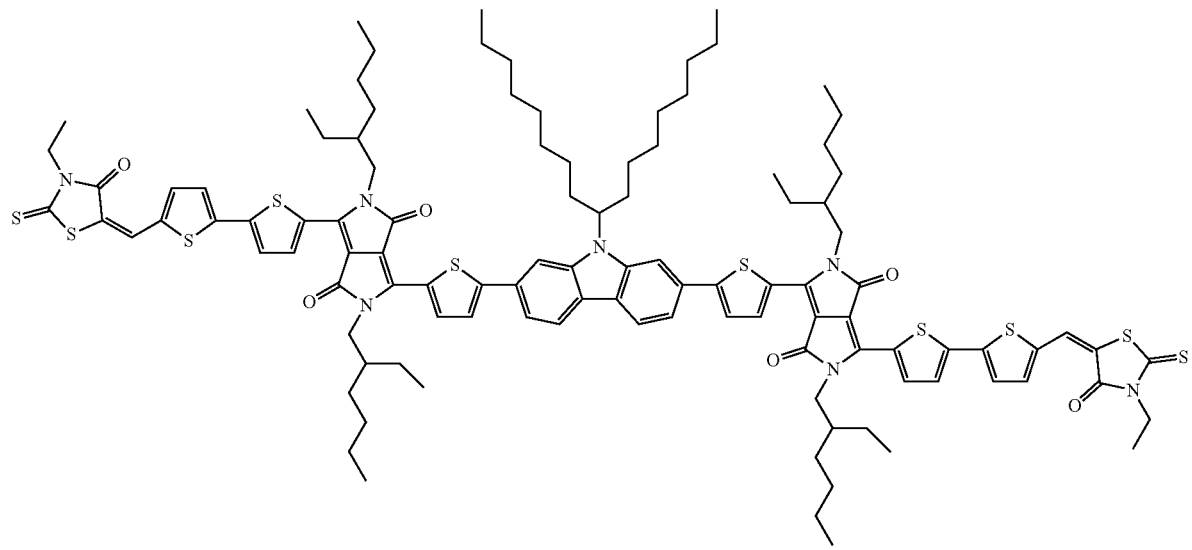

Example 3

A composite solution was prepared by dissolving the following Polymer 1 and ITIC manufactured by Solarmer Materials, Inc. at a ratio of 1:2 in 2 ml of chlorobenzene (CB), and in this case, the concentration of the composite solution was adjusted to 2.0 wt %, and an organic solar cell was made to have a structure of ITO/ZnO/a photoactive layer/$MoO_3$/Ag.

A glass substrate (117 $cm^2$) coated with ITO as a strip type was ultrasonically washed by using distilled water, acetone, and 2-propanol, and the ITO surface was treated with ozone for 10 minutes.

ZnO was bar-coated to a thickness of 45 nm on the substrate with the ITO surface treated with ozone for 10 minutes, and the substrate was heat-treated at 100° C. for 10 minutes. Bar-coating was used for the coating of the photoactive layer.

A laminate with the photoactive layer formed was dried with a wind force of 0.01 Mpa to 0.07 Mpa. More specifically, the drying was performed by using equipment (air regulator in the following FIG. 2) that blows uniformly the wind with a wind force of 0.01 Mpa to 0.07 Mpa at a height of 1 cm to 3 cm from the surface of the photoactive layer of the laminate. In this case, the temperature was 22° C. to 27° C., and the humidity was 20% to 35%.

Thereafter, $MoO_3$ was deposited to 10 nm at a rate of 0.5 Å/s by using a thermal evaporator under a vacuum of $3 \times 10^{-8}$ ton, and Ag was deposited to a thickness of 100 nm at a rate of 1 Å/s, thereby manufacturing a final organic solar cell.

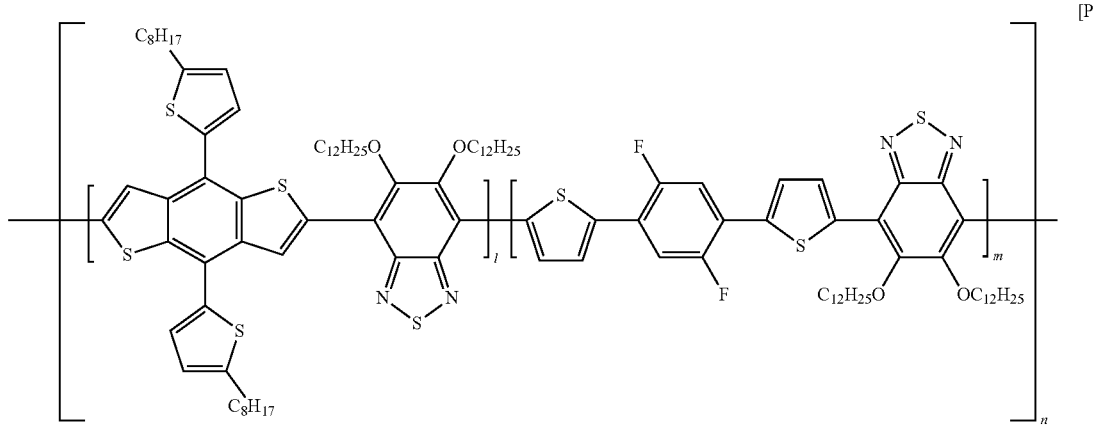

[Polymer 1]

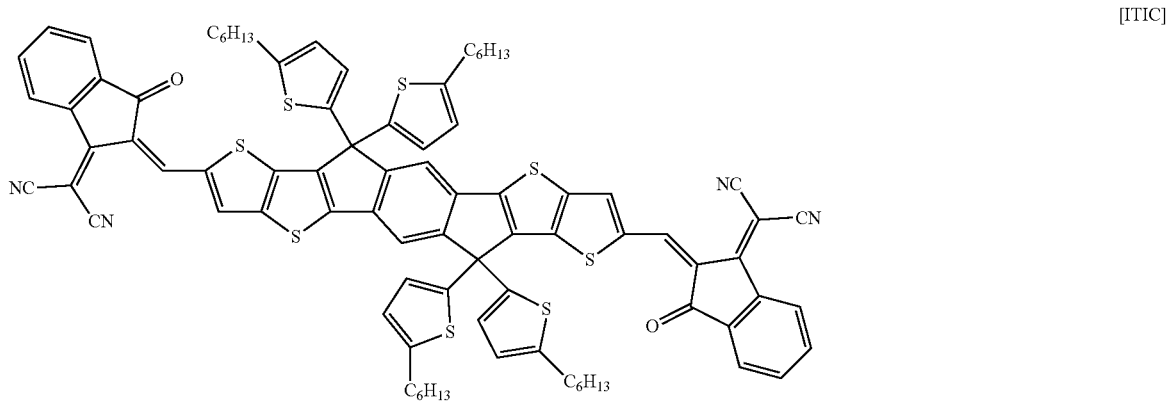

[ITIC]

Example 4
An organic solar cell was manufactured in the same manner as in Example 3, except that the following Polymer 2 was applied instead of Polymer 1 in Example 3.
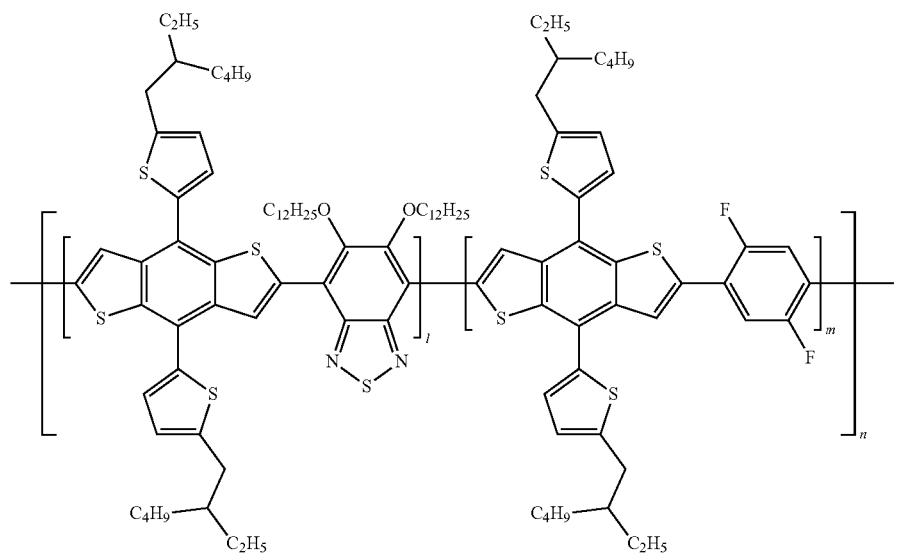
[Polymer 2]
Example 5
An organic solar cell was manufactured in the same manner as in Example 3, except that the following Polymer 3 was applied instead of Polymer 1 in Example 3.
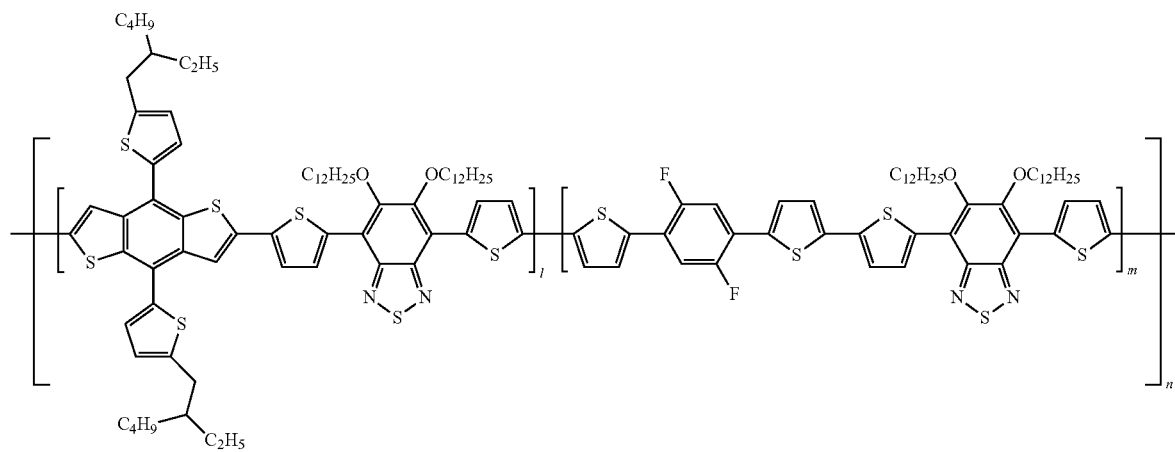
[Polymer 3]

Example 6

An organic solar cell was manufactured in the same manner as in Example 1, except that the following Polymer 4 was used instead of Compound 1 in Example 1.

[Polymer 4]

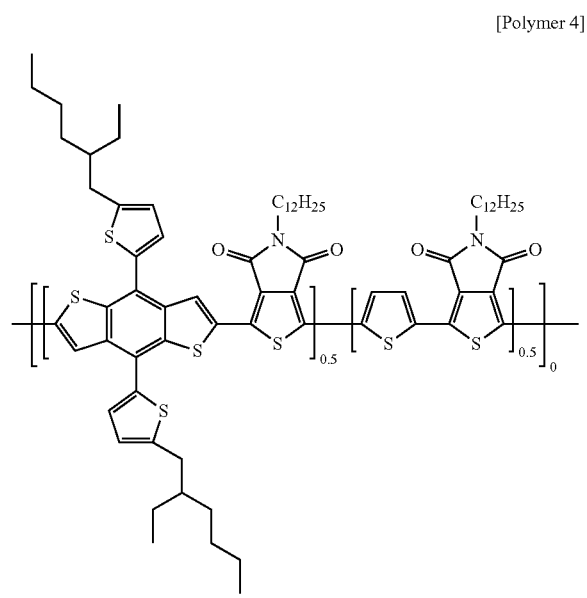

Example 7

An organic solar cell was manufactured in the same manner as in Example 1, except that the following Polymer 5 was used instead of Compound 1 in Example 1.

[Polymer 5]

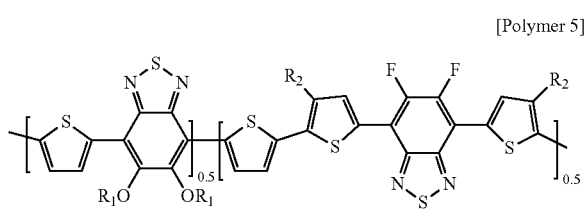

Comparative Example 1

An organic solar cell was manufactured in the same manner as in Example 1, except that the photoactive layer was naturally dried in Example 1.

Comparative Example 2

An organic solar cell was manufactured in the same manner as in Example 1, except that the photoactive layer was dried with a wind force of less than 0.01 Mpa in Example 1.

Comparative Example 3

An organic solar cell was manufactured in the same manner as in Example 1, except that the photoactive layer was dried with a wind force of more than 0.07 Mpa in Example 1.

Comparative Example 4

An organic solar cell was manufactured in the same manner as in Example 2, except that the photoactive layer was naturally dried in Example 2.

Comparative Example 5

An organic solar cell was manufactured in the same manner as in Example 2, except that the photoactive layer was dried with a wind force of less than 0.01 Mpa in Example 2.

Comparative Example 6

An organic solar cell was manufactured in the same manner as in Example 2, except that the photoactive layer was dried with a wind force of more than 0.07 Mpa in Example 2.

Comparative Example 7

An organic solar cell was manufactured in the same manner as in Example 3, except that the photoactive layer was naturally dried in Example 3.

Comparative Example 8

An organic solar cell was manufactured in the same manner as in Example 3, except that the photoactive layer was dried with a wind force of less than 0.01 Mpa in Example 3.

Comparative Example 9

An organic solar cell was manufactured in the same manner as in Example 3, except that the photoactive layer was dried with a wind force of more than 0.07 Mpa in Example 3.

Comparative Example 10

An organic solar cell was manufactured in the same manner as in Example 4, except that the photoactive layer was naturally dried in Example 4.

Comparative Example 11

An organic solar cell was manufactured in the same manner as in Example 4, except that the photoactive layer was dried with a wind force of less than 0.01 Mpa in Example 4.

Comparative Example 12

An organic solar cell was manufactured in the same manner as in Example 4, except that the photoactive layer was dried with a wind force of more than 0.07 Mpa unlike Example 4.

Comparative Example 13

An organic solar cell was manufactured in the same manner as in Example 5, except that the photoactive layer was naturally dried in Example 5.

Comparative Example 14

An organic solar cell was manufactured in the same manner as in Example 5, except that the photoactive layer was dried with a wind force of less than 0.01 Mpa in Example 5.

Comparative Example 15

An organic solar cell was manufactured in the same manner as in Example 5, except that the photoactive layer was dried with a wind force of more than 0.07 Mpa in Example 5.

Experimental Examples

After the physical properties of the organic solar cells according to Examples 1 to 5 and Comparative Examples 1 to 15 were each measured three times, the average values thereof were calculated and are summarized in the following Table 1.

TABLE 1

| | Voc (V) | Jsc (mA/cm$^2$) | FF | η (%) |
|---|---|---|---|---|
| Example 1 | 4.612 | 2.212 | 0.549 | 5.60 |
| Example 2 | 4.006 | 2.013 | 0.595 | 4.80 |
| Example 3 | 4.666 | 2.616 | 0.598 | 7.30 |
| Example 4 | 4.496 | 2.527 | 0.628 | 7.14 |
| Example 5 | 4.064 | 2.840 | 0.613 | 7.08 |
| Example 6 | 4.276 | 1.898 | 0.367 | 2.98 |
| Example 7 | 3.570 | 1.758 | 0.487 | 3.06 |
| Comparative Example 1 | 3.336 | 0.862 | 0.416 | 1.20 |
| Comparative Example 2 | 3.638 | 0.867 | 0.463 | 1.46 |
| Comparative Example 3 | 4.599 | 0.951 | 0.498 | 2.18 |
| Comparative Example 4 | 2.742 | 1.691 | 0.449 | 2.08 |
| Comparative Example 5 | 3.230 | 1.744 | 0.478 | 2.69 |
| Comparative Example 6 | 4.110 | 1.729 | 0.507 | 3.60 |
| Comparative Example 7 | 4.095 | 1.400 | 0.450 | 2.58 |
| Comparative Example 8 | 4.146 | 1.699 | 0.413 | 2.91 |
| Comparative Example 9 | 4.519 | 1.697 | 0.440 | 3.37 |
| Comparative Example 10 | 4.368 | 1.277 | 0.459 | 2.56 |
| Comparative Example 11 | 4.293 | 1.475 | 0.459 | 2.91 |
| Comparative Example 12 | 4.477 | 1.714 | 0.405 | 3.11 |
| Comparative Example 13 | 3.835 | 1.256 | 0.414 | 1.99 |
| Comparative Example 14 | 3.910 | 1.239 | 0.416 | 2.02 |
| Comparative Example 15 | 3.843 | 1.889 | 0.491 | 3.56 |

In the present specification, $V_{oc}$, $J_{sc}$, FF, and η mean an open circuit voltage, a short circuit current, a fill factor, and energy conversion efficiency, respectively.

The open circuit voltage is defined as a voltage produced when light is irradiated without an external electrical load, that is, a voltage when a current is 0, and the short circuit current is defined as a current produced when light is irradiated by the short-circuited electric contact, that is, a current by light when a voltage is not applied.

Further, the fill factor is defined as a value obtained by dividing the product of the current and the voltage, which vary depending on the application of current and voltage, by the product of the open circuit voltage and the short circuit current. It is evaluated that the closer the fill factor is to 1, the higher the efficiency of the solar cell becomes, and the lower the fill factor is, the higher the resistance becomes.

As in the results, when Examples 1 to 7 are compared with Comparative Examples 1 to 15, according to the method for manufacturing an organic solar cell according to an exemplary embodiment of the present application, it is possible to induce an appropriate phase separation between an electron donor and an electron acceptor by optimizing the drying of a photoactive layer formed by a bar, a slot die, and the like.

Further, an organic solar cell manufactured by the method for manufacturing an organic solar cell according to an exemplary embodiment of the present application has an effect in that the energy conversion efficiency is excellent.

In addition, when Examples 1 to 5 are compared with Examples 6 and 7, the case where the electron donor comprises a polymer compound and the electron acceptor comprises a non-fullerene-based compound or the case where the electron donor comprises a single molecular compound and the electron acceptor comprises a fullerene-based compound may have an effect in that the organic solar cell has better energy conversion efficiency, as compared to the case where the electron donor comprises a polymer compound and the electron acceptor comprises a fullerene-based compound.

What is claimed is:

1. A method for manufacturing an organic solar cell, the method comprising:
    providing a substrate;
    forming a first electrode on the substrate;
    forming a photoactive layer on the first electrode, wherein the forming of the photoactive layer is performed by using a slot die, a bar coater, a doctor blade, or dip coating;
    drying the photoactive layer with a wind force in a range of 0.01 Mpa to 0.07 Mpa; and
    forming a second electrode on the photoactive layer.

2. The method of claim 1, wherein the photoactive layer comprises an electron donor and an electron acceptor, the electron donor comprises a single molecular compound, and the electron acceptor comprises a fullerene-based compound.

3. The method of claim 2, wherein the single molecular compound comprises a compound of Formula 1:

[Formula 1]

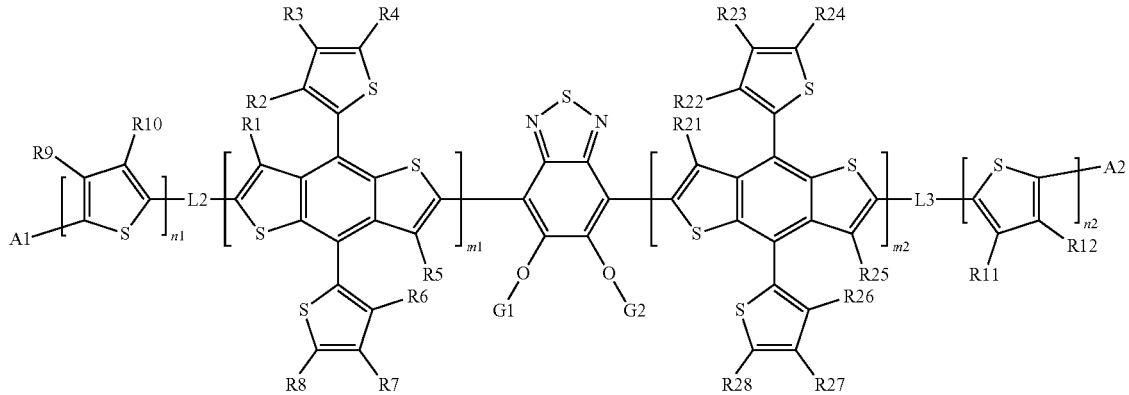

wherein:

m1, m2, n1, and n2 are each an integer from 1 to 3;

when m1, m2, n1, and n2 are each 2 or more, two or more structures in the square bracket are the same as or different from each other;

L2 and L3 are the same as or different from each other, and are each independently a direct bond or a divalent linking group;

G1 and G2 are the same as or different from each other, and are each independently a substituted or unsubstituted branched alkyl group; and A1 and A2 are the same as or different from each other, and are each independently a structure which acts as an electron acceptor.

4. The method of claim 2, wherein the single molecular compound comprises a compound of Formula 2:

[Formula 2]

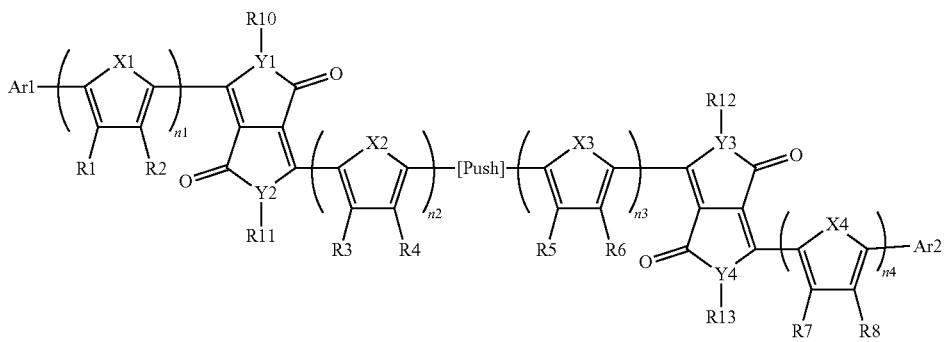

R1 to R12 and R21 to R28 are the same as or different from each other, and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, or a substituted or unsubstituted heterocyclic group comprising one or more of N, O, and S atoms;

wherein:

n1 to n4 are each an integer from 1 to 3;

when n1 to n4 are each 2 or more, two or more structures in the parenthesis are the same as or different from each other;

X1 to X4 are the same as or different from each other, and are each independently CRR', NR, O, SiRR', PR, S, GeRR', Se, or Te;

Y1 to Y4 are the same as or different from each other, and are each independently CR", N, SiR", P, or GeR";

R, R', R", R1 to R8, and R10 to R13 are the same as or different from each other, and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, or a substituted or unsubstituted heterocyclic group;

[Push] has a structure which acts as an electron donor, and the structure is any one of the following structures;

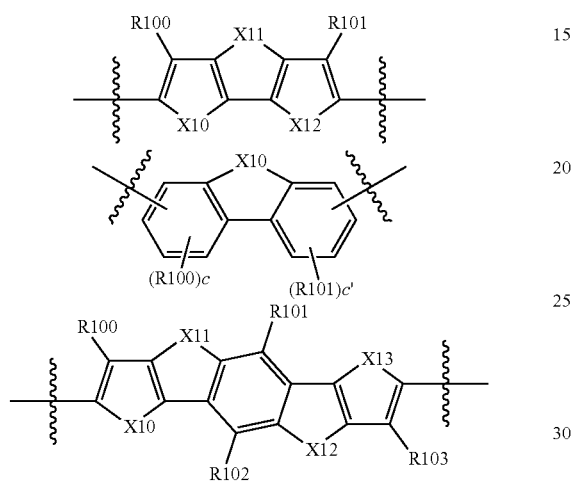

c and c' are each an integer from 1 to 3;

when c is 2 or more, two or more R100 are the same as or different from each other;

when c' is 2 or more, two or more R101 are the same as or different from each other;

X10 to X13 are the same as or different from each other, and are each independently CRaRb, NRa, O, SiRaRb, PRa, S, GeRaRb, Se, or Te;

Ra, Rb, and R100 to R103 are the same as or different from each other, and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, or a substituted or unsubstituted heterocyclic group;

Ar1 and Ar2 are the same as or different from each other, and are each independently any one of the following structures:

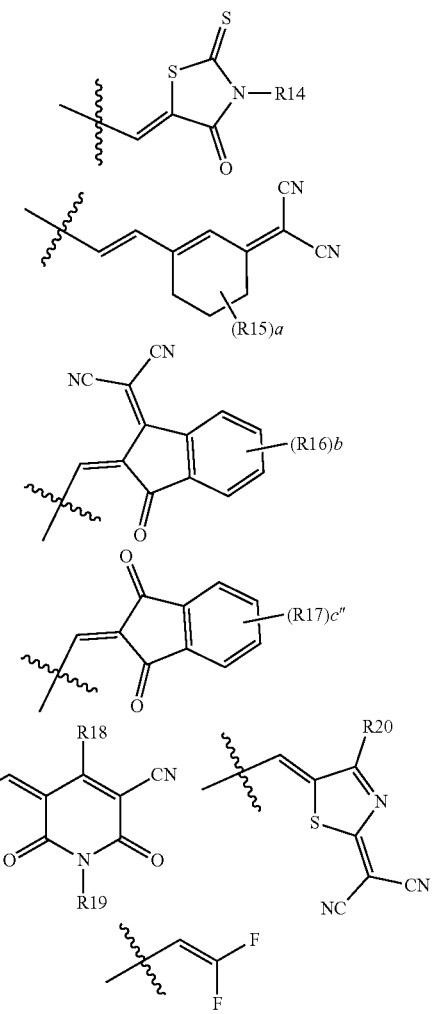

wherein:

a is an integer from 1 to 7;

b and c" are each an integer from 1 to 4;

when a is 2 or more, two or more R15 are the same as or different from each other;

when b is 2 or more, two or more R16 are the same as or different from each other;

when c" is 2 or more, two or more R17 are the same as or different from each other; and R14 to R20 are the same as or different from each other, and are each independently hydrogen, deuterium, a halogen group, a nitrile group a nitro group, an imide group an amide group a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group a substituted or unsubstituted aryl group, or a substituted or unsubstituted heterocyclic group.

5. The method of claim 1, wherein the photoactive layer comprises an electron donor and an electron acceptor, the electron donor comprises a polymer compound, and the electron acceptor comprises a non-fullerene-based compound.

6. The method of claim 5, wherein the polymer compound comprises a polymer comprising: a first unit of Formula 3; a second unit of Formula 4; and a third unit of Formula 5:

[Formula 3]

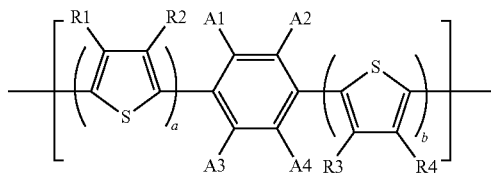

[Formula 4]

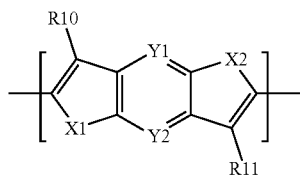

R, R', R'', Q1 to Q4, R1 to R4, R10, and R11 are the same as or different from each other, and are each independently hydrogen, deuterium, a halogen group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkenyl group, a substituted or unsubstituted amine group, a substituted or unsubstituted aryl group, or a substituted or unsubstituted heterocyclic group;

R20 and R21 are the same as or different from each other, and are each independently a substituted or unsubstituted alkoxy group or a substituted or unsubstituted aryloxy group;

a, b, d, and e are each an integer from 0 to 3;

when a, b, d, or e is 2 or more, two or more structures in the parenthesis are the same as or different from each other; and A1 to A4 are the same as or different from each other; and are each independently hydrogen, fluorine, or chlorine, and at least one of A1 to A4 is fluorine or chlorine.

7. The method of claim 5, wherein the non-fullerene-based compound comprises a compound of Formula A:

[Formula A]

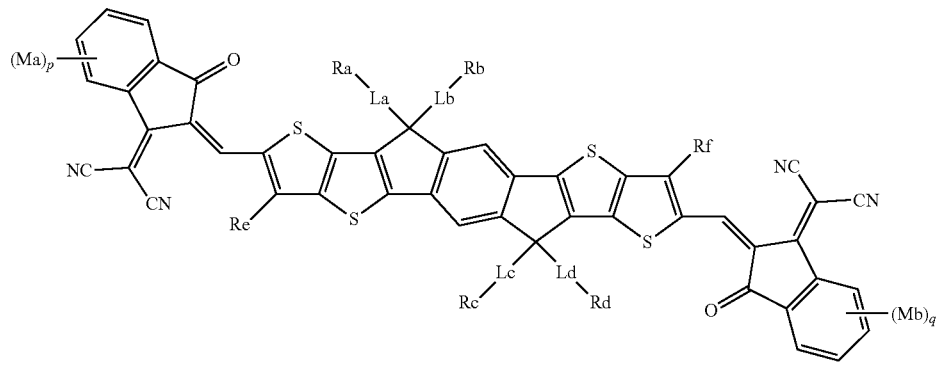

-continued

[Formula 5]

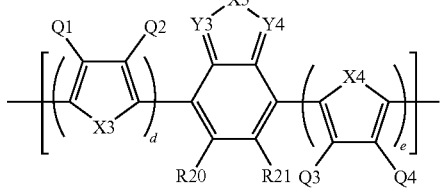

wherein:
X1 to X5 are the same as or different from each other, and are each independently selected from the group consisting of CRR', NR, O, SiRR', PR, S, GeRR', Se, and Te;

Y1 to Y4 are the same as or different from each other, and are each independently selected from the group consisting of CR'', N, SiR'', P, and GeR'';

wherein:
Ra to Rf are the same as or different from each other, and are each independently hydrogen or a substituted or unsubstituted alkyl group;

La to Ld are the same as or different from each other, and each independently a substituted or unsubstituted arylene group or a substituted or unsubstituted divalent heterocyclic group;

Ma and Mb are the same as or different from each other, and are each independently hydrogen, a halogen group, or a substituted or unsubstituted alkyl group;

p and q are the same as or different from each other, and are each independently an integer from 0 to 2; and when p or q is 2, structures in the parenthesis are the same as each other.

8. An organic solar cell manufactured by the method for manufacturing an organic solar cell according to claim 1.

9. The method of claim 3, wherein the compound of Formula 1 is a compound of Formula 1-1:

[Formula 1-1]

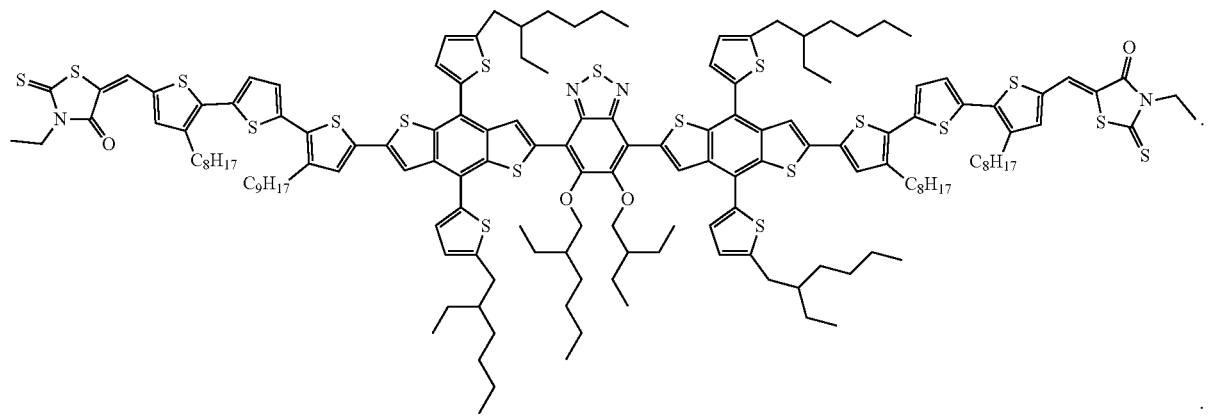

10. The method of claim 4, wherein the [Push] of the compound of the Formula 2 is

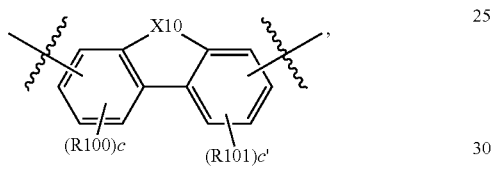

and c, c', X10, R100, and R101 are the same as those defined in Formula 2.

11. The method of claim 5, wherein the polymer compound comprises a unit of Formula 7-1:

[Formula 7-1]

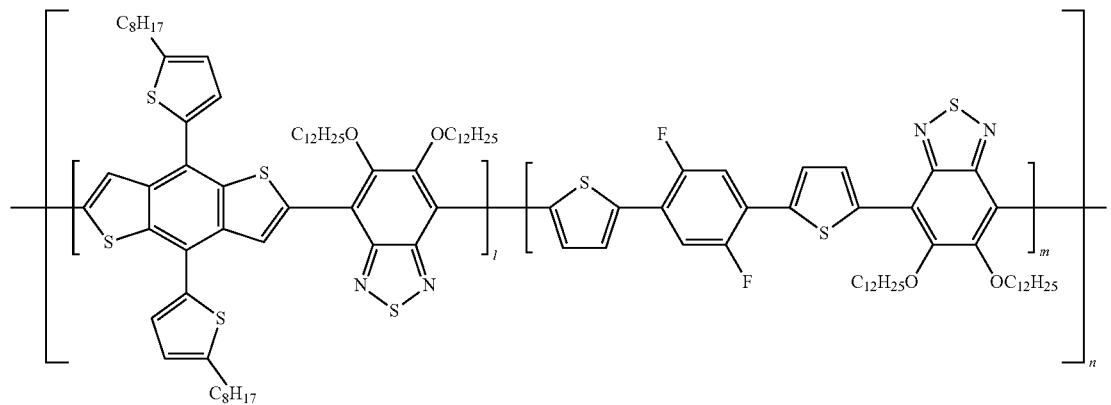

wherein:

l is a mole fraction, and a real number of $0<l<1$;

m is a mole fraction, and a real number of $0<m<1$;

$l+m=1$; and n is a repeating number of the unit, and an integer from 1 to 10,000.

12. The method of claim 5, wherein the polymer compound comprises a unit of Formula 8 or Formula 9:

[Formula 8]
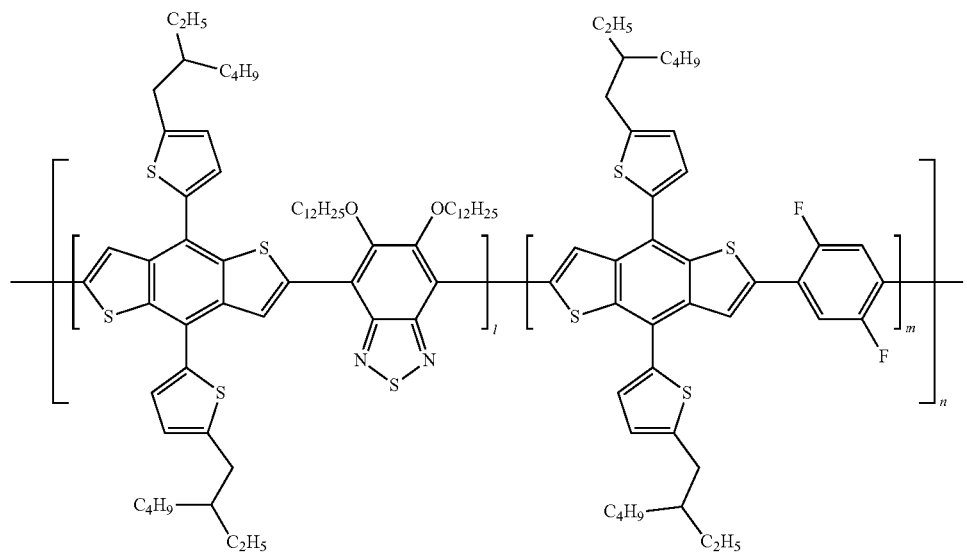
[Formula 9]
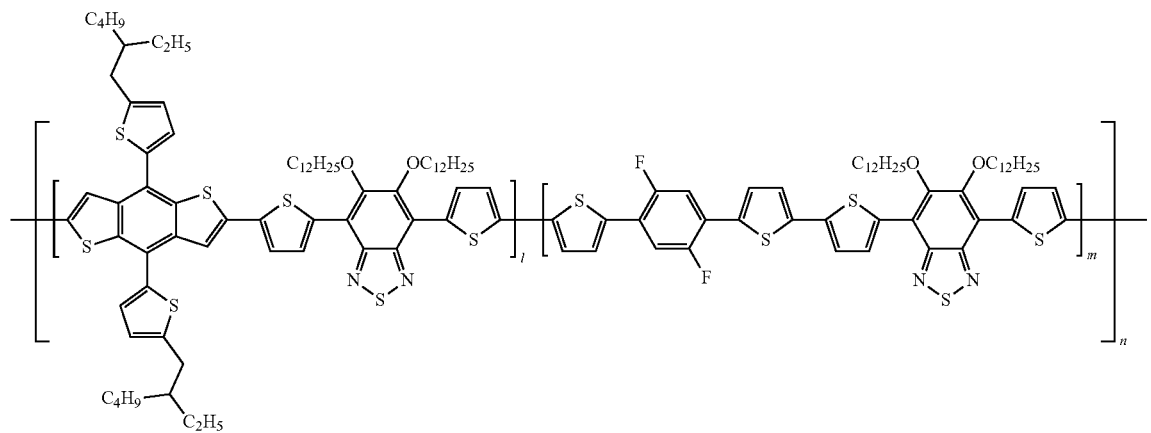
wherein:
l is a mole fraction, and a real number of 0<l<1;
m is a mole fraction, and a real number of 0<m<1;
l+m=1; and
n is a repeating number of the unit, and an integer from 1 to 10,000.
13. The method of claim 7, wherein the compound of Formula A is a compound of Formulae A-1 through A-5:
[Formula A-1]
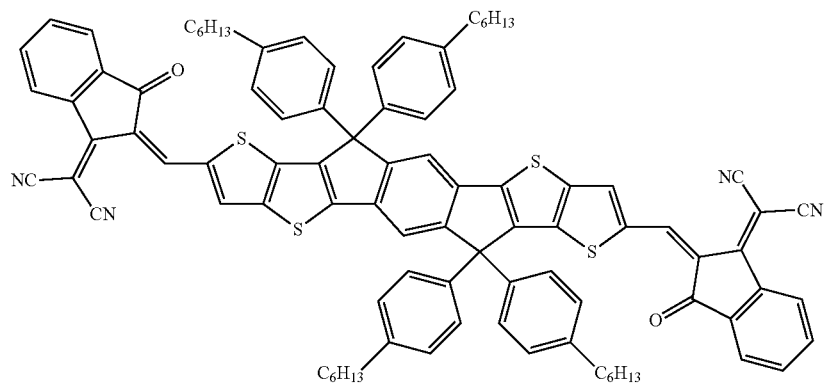

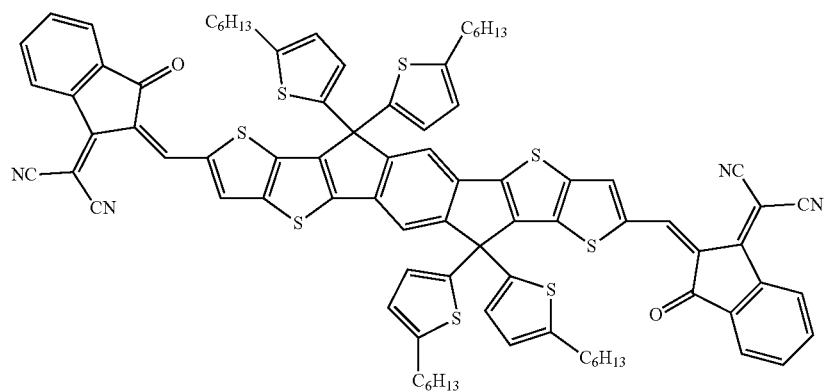
[Formula A-2]
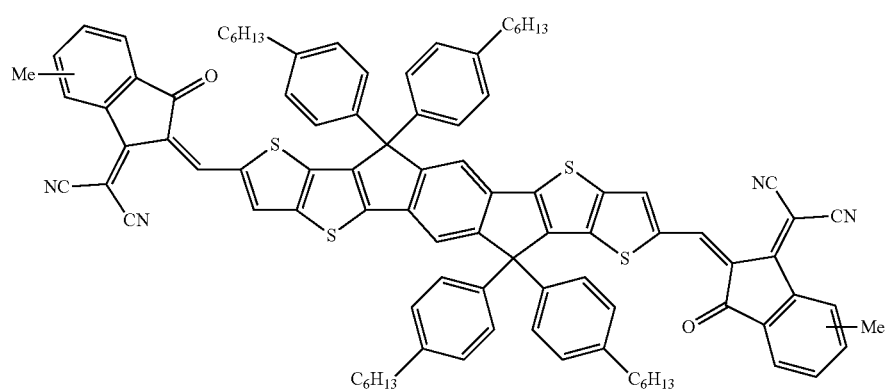
[Formula A-3]
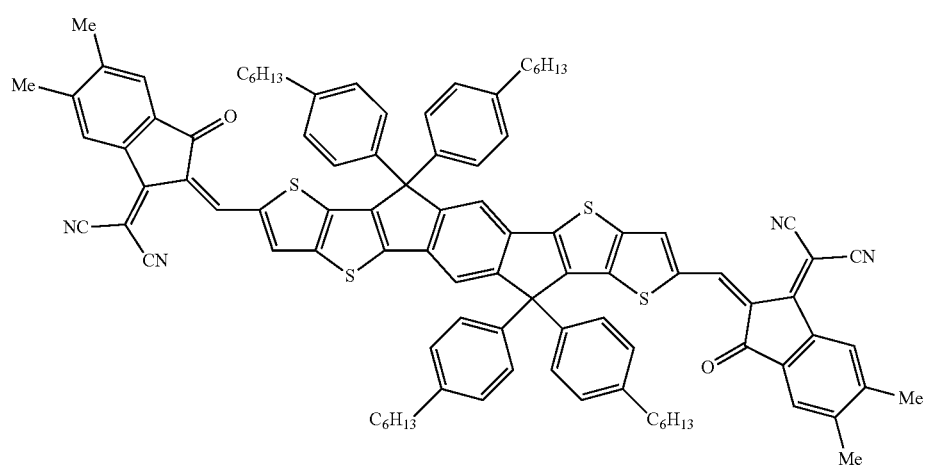
[Formula A-4]

[Formula A-5]
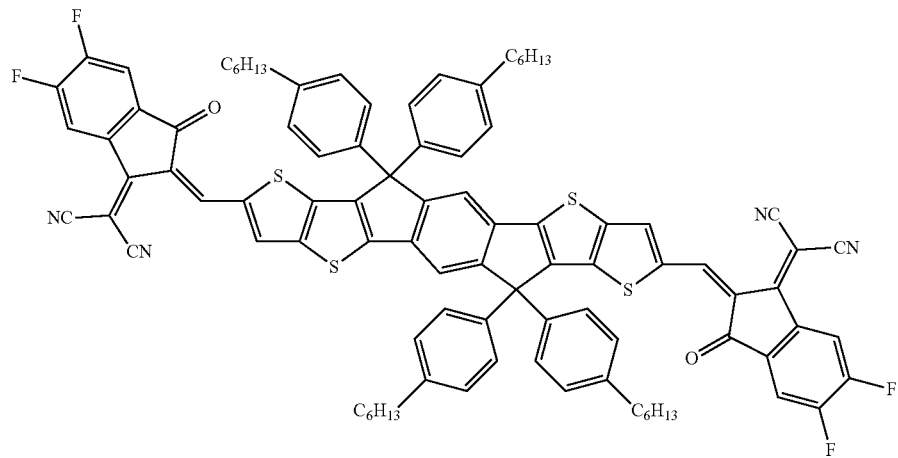
wherein Me is a methyl group.
* * * * *